United States Patent
Yi et al.

(10) Patent No.: US 10,408,688 B2
(45) Date of Patent: Sep. 10, 2019

(54) FEEDBACK DEVICE PROVIDING THERMAL FEEDBACK

(71) Applicant: TEGWAY CO., LTD., Daejeon (KR)

(72) Inventors: Kyoung Soo Yi, Daejeon (KR); Ock Kyun Oh, Daejeon (KR)

(73) Assignee: TEGWAY CO., LTD., Daejeon (KR)

( * ) Notice: Subject to any disclaimer, the term of this patent is extended or adjusted under 35 U.S.C. 154(b) by 0 days.

(21) Appl. No.: 16/083,464

(22) PCT Filed: Apr. 13, 2017

(86) PCT No.: PCT/KR2017/004032
§ 371 (c)(1),
(2) Date: Sep. 7, 2018

(87) PCT Pub. No.: WO2017/183858
PCT Pub. Date: Oct. 26, 2017

(65) Prior Publication Data
US 2019/0072438 A1     Mar. 7, 2019

Related U.S. Application Data

(60) Provisional application No. 62/449,500, filed on Jan. 23, 2017.

(30) Foreign Application Priority Data

Apr. 19, 2016  (KR) .......................... 10-2016-0047503
Jun. 9, 2016   (KR) .......................... 10-2016-0071860

(51) Int. Cl.
*F25B 21/04*     (2006.01)
*G01K 13/00*     (2006.01)
(Continued)

(52) U.S. Cl.
CPC ............. *G01K 13/002* (2013.01); *G06F 3/00* (2013.01); *H01L 35/02* (2013.01); *H01L 35/12* (2013.01); *H01L 35/34* (2013.01)

(58) Field of Classification Search
CPC ......... G01K 13/002; G06F 3/00; H01L 35/02; H01L 35/12; H01L 35/34
See application file for complete search history.

(56) References Cited

U.S. PATENT DOCUMENTS

2012/0258800 A1* 10/2012 Mikhailov .............. G06F 3/016
                                                           463/37
2014/0339211 A1* 11/2014 Barfuss .................. B60N 2/002
                                                           219/202
(Continued)

FOREIGN PATENT DOCUMENTS

JP     2004-318400 A    11/2004
JP     2005-077066 A     3/2005
(Continued)

OTHER PUBLICATIONS

International Search Report dated Mar. 19, 2018 in application No. PCT/KR2017/011867.

*Primary Examiner* — Munear T Akki
(74) *Attorney, Agent, or Firm* — Maschoff Brennan

(57) ABSTRACT

Provided is a feedback device providing thermal feedback. The feedback device, according to one embodiment, may comprise a casing, a heat output module, and a feedback controller. The casing comprises: a contact part, with which a user makes contact when the feedback device moves when a content is being played; and a noncontact part with which the user does not make contact even though the feedback device moves. The heat output module comprises: flexible first and second substrates; a thermoelectric element interposed between the first the second substrates and performing a thermoelectric operation for thermal feedback; and a
(Continued)

contact surface disposed on the second substrate. The heat output module is disposed on the curve-shaped inside or outside of the contact part, and outputs thermal feedback to the user via the second substrate and the contact surface. The feedback controller is configured so as to control the thermal output module.

17 Claims, 32 Drawing Sheets

(51) Int. Cl.
*G06F 3/00* (2006.01)
*H01L 35/02* (2006.01)
*H01L 35/12* (2006.01)
*H01L 35/34* (2006.01)

(56) References Cited

U.S. PATENT DOCUMENTS

2017/0192620 A1  7/2017  Kim et al.
2018/0098635 A1  4/2018  Jeon et al.

FOREIGN PATENT DOCUMENTS

| | | |
|---|---|---|
| JP | 2009-018055 A | 1/2009 |
| JP | 2009-276996 A | 11/2009 |
| JP | 2012-217861 A | 11/2012 |
| KR | 10-2007-0066931 A | 6/2007 |
| KR | 10-2014-0105045 A | 9/2014 |
| KR | 10-2015-0035634 A | 4/2015 |
| KR | 10-2015-0138252 A | 12/2015 |
| KR | 10-2016-0124388 A | 10/2016 |
| WO | 2014/189195 A1 | 11/2014 |
| WO | 2016/021747 A1 | 2/2016 |

\* cited by examiner 1600-6

FIG. 20
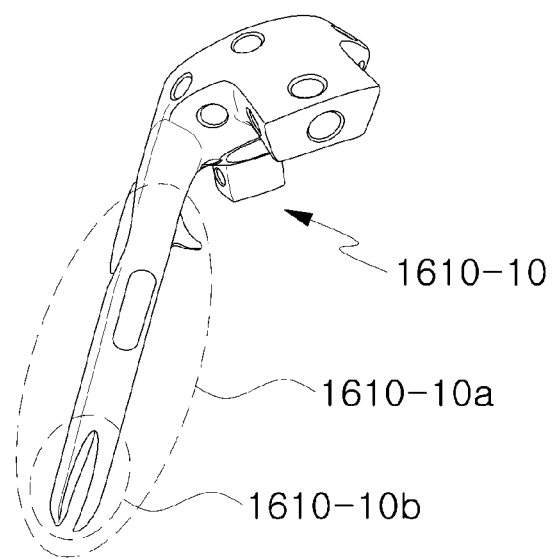
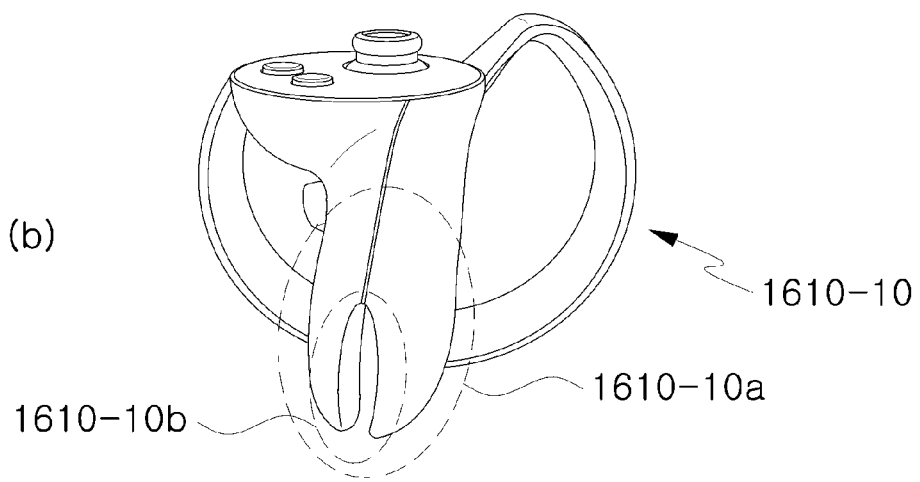

FIG. 27
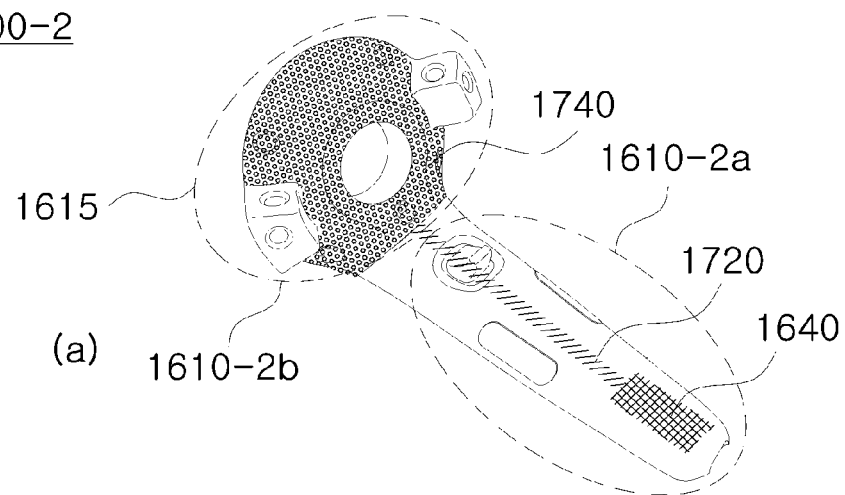
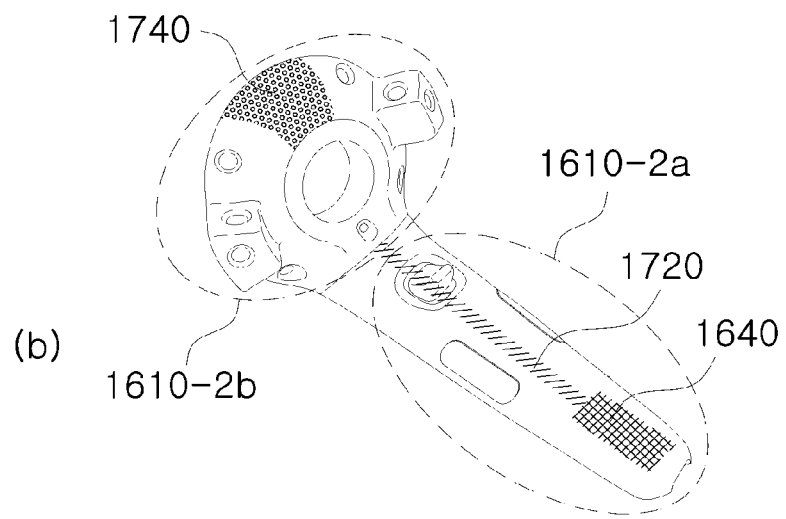

FIG. 28
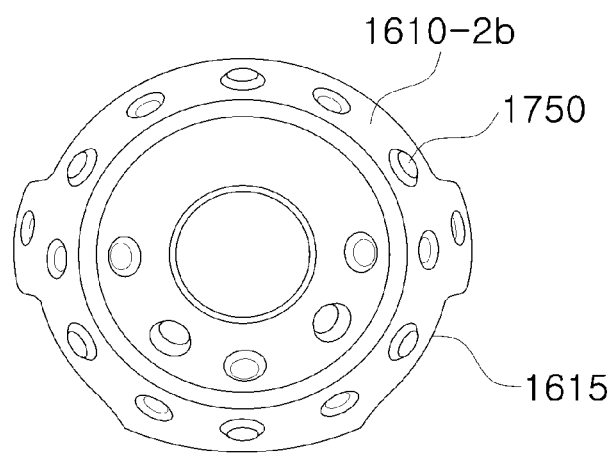
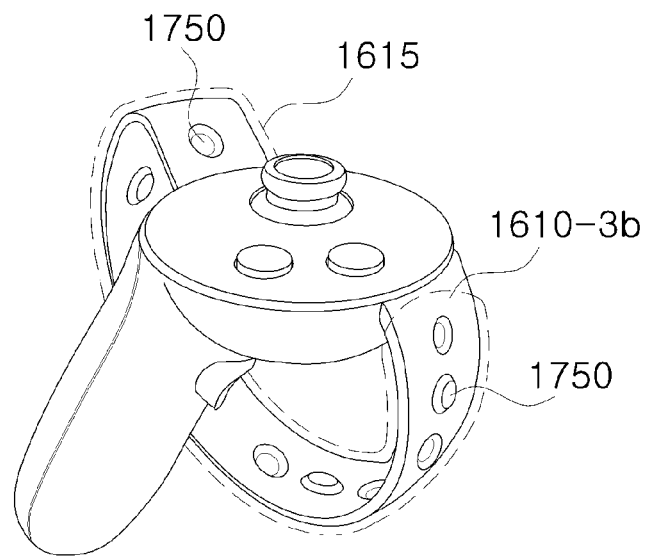

FIG. 29
(a)
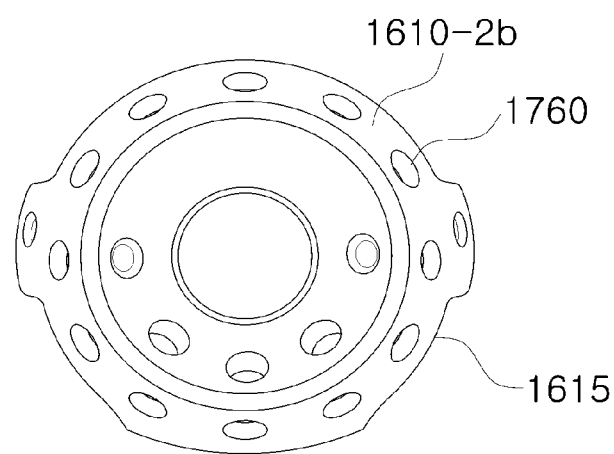
(b)
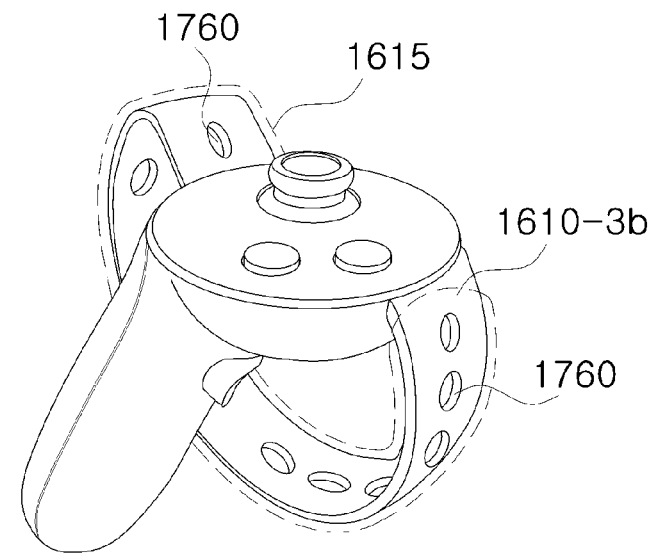

FIG. 30
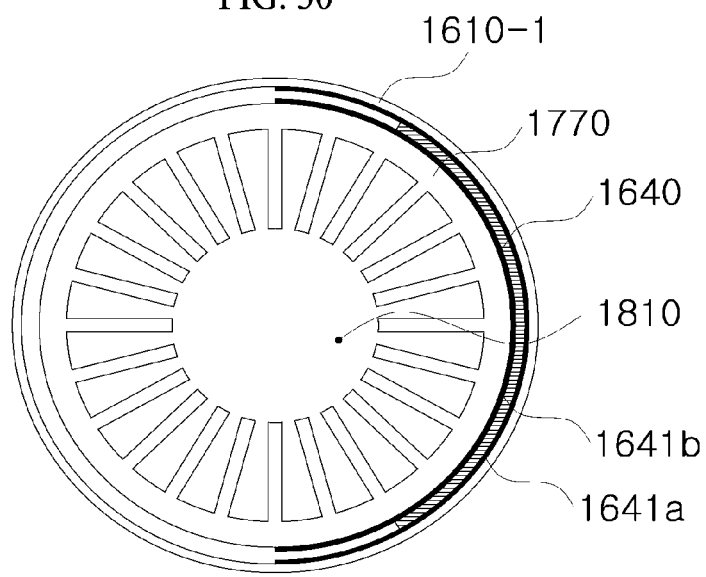
(a)
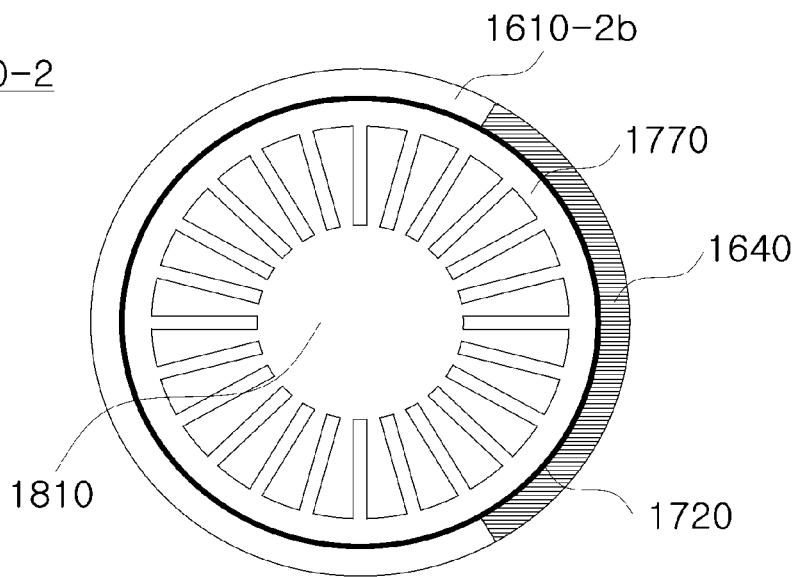
(b)

FIG. 32
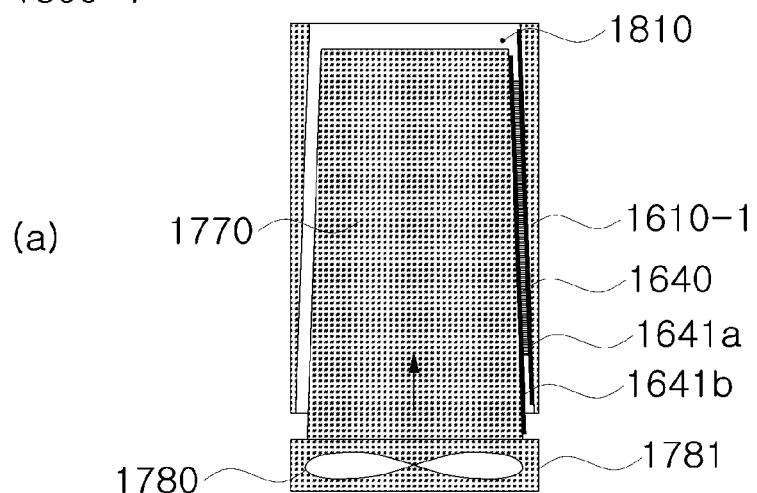
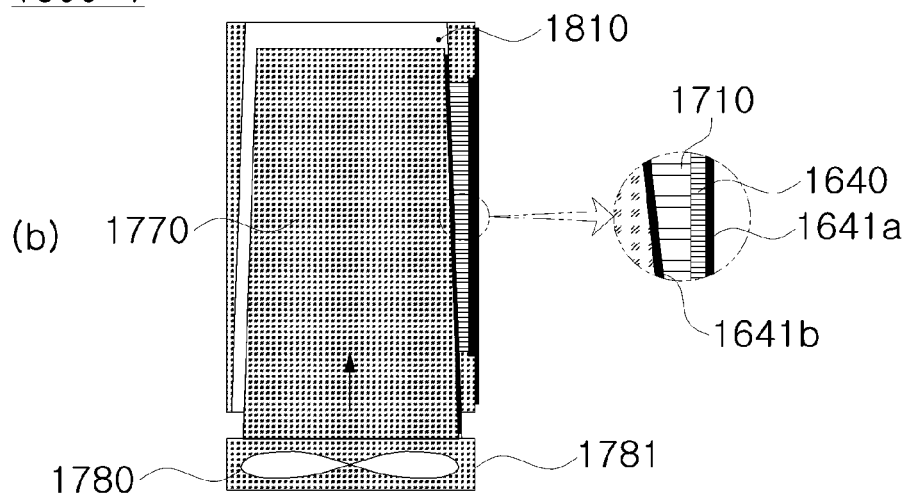

FEEDBACK DEVICE PROVIDING THERMAL FEEDBACK

TECHNICAL FIELD

Embodiments relate to a feedback device for providing thermal feedback.

BACKGROUND ART

Recently, with the development of technologies for virtual reality (VR) and augmented reality (AR), demands for providing feedback through various senses to improve user's immersion in content have been increasing. In particular, in the 2016 Consumer Electronics Show (CES), virtual reality technology was introduced as one of future promising technologies. With this trend, research is being actively carried out to provide a user experience with respect to all human senses including an olfactory sense and a tactile sense beyond a user experience (UX) which is mainly limited to a visual sense and an auditory sense.

A thermoelement (TE) is a device which produces an exothermic reaction or an endothermic reaction through a Peltier effect by receiving electric energy. The thermoelement is expected to be used for providing thermal feedback to a user. However, a conventional thermoelement mainly using a flat substrate has been limited in application thereof because it is difficult to press the conventional thermoelement against a user's body part. However, in recent years, as development of a flexible thermoelement (FTE) has reached a successful stage, the flexible thermoelement is expected to overcome the problems of the conventional thermoelectric devices and to effectively transfer thermal feedback to a user.

DISCLOSURE

Technical Problem

The present invention is directed to providing a feedback device capable of improving user's immersion in content by proving thermal feedback to a user through the feedback device used for a variety of content such as virtual reality, augmented reality, and games.

In addition, the present invention is directed to providing a feedback device capable of effectively dissipating waste heat generated during a process of providing thermal feedback such that a user does not feel the waste heat.

Objects of the present invention may not be limited to the above, and other objects will be clearly understandable to those having ordinary skill in the art from the disclosures provided below together with accompanying drawings.

Technical Solution

According to an aspect of the present invention, a feedback device providing a thermal experience according to a thermal event to a user in accordance with reproduction of multimedia content including the thermal event includes: a casing including a contact part that is a region with which the user comes into contact in a case in which the feedback device is moved when the content is reproduced and including a noncontact part that is a region with which the user does not come into contact although the feedback device is moved; a heat output module including a first substrate and a second substrate having flexibility, a thermoelectric element disposed between the first substrate and the second substrate and configured to perform a thermoelectric operation for the thermal feedback wherein the thermoelectric operation includes an exothermic operation and an endothermic operation, and a contact surface disposed on the second substrate, wherein the heat output module is disposed inside or outside a curved shape of the contact part due to the flexibility of the first substrate and the second substrate and transfers heat generated by the thermoelectric operation to the user through the second substrate and the contact surface to output the thermal feedback; a feedback controller configured to control the heat output module; and a heat dissipation unit configured to dissipate waste heat from the noncontact part when the waste heat is generated toward the first substrate as the thermoelectric element performs the endothermic operation such that temperature of at least a portion of the contact surface is less than a certain temperaturewherein the waste heat indicates the remaining heat, except for heat for providing the thermal feedback among the heat generated in the thermoelectric element, wherein the heat dissipation unit includes a heat transfer part configured to form a heat transfer path from the heat output module to the noncontact part such that the waste heat is transferred from the heat output module to the noncontact part; and a heat dissipation part configured to dissipate the waste heat received through the heat transfer path, wherein the waste heat is moved along the heat transfer path from the contact part to the noncontact part in which the heat output module is disposed and is dissipated from the noncontact part.

Technical solutions of the present invention may not be limited to the above, and other technical solutions of the present invention will be clearly understandable to those having ordinary skill in the art from the disclosures provided below together with accompanying drawings.

Advantageous Effects

According to the present invention, thermal feedback can be provided to a user through a feedback device used for a variety of content such as virtual reality, augmented reality, and a game, thereby improving user's immersion in content.

In addition, according to the present invention, since waste heat generated during a process of providing thermal feedback is effectively dissipated, a user cannot feel the waste heat.

Effects of the present invention may not be limited to the above, and other effects of the present invention will be clearly understandable to those having ordinary skill in the art from the disclosures provided below together with accompanying drawings.

DESCRIPTION OF DRAWINGS

FIGS. 11 to 20 are views illustrating a feedback device including a casing with various shapes according to an exemplary embodiment of the present invention.

FIG. 27 is a view illustrating an example of a noncontact part including a material with high heat dissipation performance according to an exemplary embodiment of the present invention.

FIG. 28 is a view illustrating an example in which patterns according to an exemplary embodiment of the present invention are applied.

FIG. 29 is a view illustrating an example in which hollow portions according to an exemplary embodiment of the present invention are applied.

FIG. 30 is a view illustrating an example in which heat dissipation fins according to an exemplary embodiment of the present invention are applied to a noncontact part.

FIGS. 31 and 32 are views illustrating examples in which a heat dissipation fan according to an exemplary embodiment of the present invention is applied.

BEST MODE FOR CARRYING OUT THE INVENTION

Figure 1:
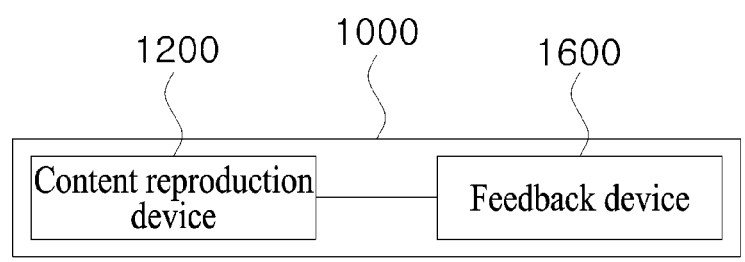
FIG. 1 is a block diagram illustrating a configuration of a thermal experience providing system according to an exemplary embodiment of the present invention.

According to an aspect of the present invention, a feedback device providing a thermal experience according to a thermal event to a user in accordance with reproduction of multimedia content including the thermal event may include: a casing including a contact part that is a region with which the user comes into contact in a case in which the feedback device is moved when the content is reproduced, and a noncontact part that is a region with which the user does not come into contact although the feedback device is moved; a heat output module including a first substrate and a second substrate having flexibility, a thermoelectric element disposed between the first substrate and the second substrate and configured to perform a thermoelectric operation for the thermal feedbackwherein the thermoelectric operation includes an exothermic operation and an endothermic operation, and a contact surface disposed on the second substrate, wherein the heat output module is disposed inside or outside a curved shape of the contact part due to the flexibility of the first substrate and the second substrate and transfers heat generated by the thermoelectric operation to the user through the second substrate and the contact surface to output the thermal feedback; and a feedback controller configured to control the heat output module.

[Modes of the Invention]

Exemplary embodiments described in this specification are made to clearly explain the scope of the invention to those having ordinary skill in the art and do not intend to limit the present invention. It should be interpreted that the present invention may include substitutions and modifications within the technical scope of the present invention.

The terms used in this specification are selected from general terms, which are currently widely used, based on functions of components according to the exemplary embodiment of the present invention, and may have meanings varying according to the intentions of those skilled in the art, the custom in the field of art or advent of new technology. If a specific term is used with a specific meaning, the meaning of the term will be described specifically. Accordingly, the terms used in this specification should not be defined as simple names of the components, but be defined based on the actual meaning of the terms and the whole context throughout the present specification.

The accompanying drawings are to facilitate the explanation of the present invention and the shape in the drawings may be exaggerated for the purpose of convenience of explanation, so the present invention should not be limited to the drawings.

The details of the generally known function and structure, which make the subject matter of the present invention unclear, are omitted.

1. Thermal Experience Providing System 1.1. Overview of Thermal Experience Providing System A thermal experience providing system 1000 according to an exemplary embodiment of the present invention is a system which allows a user to experience a thermal experience (TX). Specifically, the thermal experience providing system 1000 may allow a user to experience a thermal experience by outputting thermal feedback as a part of a formed of a representation of content when multimedia content is reproduced.

Herein, the thermal feedback is a kind of thermal stimulation which allows a user to feel a thermal sensation by stimulating thermal sensory organs mainly distributed in a user's body and in the present specification the thermal feedback should be interpreted to include all the thermal stimuli which stimulate a thermal sensory system of the user.

Representative examples of the thermal feedback include hot feedback and cold feedback. The hot feedback means thermal feedback which allows a user to feel a hot sensation by applying hot heat to a hot spot distributed on a user's skin and the cold feedback means thermal feedback which allows a user to feel a cold sensation by applying cold heat to a cold spot distributed on a user's skin.

Herein, since the heat is a physical quantity represented by a scalar form, the expression, "applying cold heat," or "transferring cold heat," may not be an exact expression from a physical point of view. However, for convenience of description in the present description, a phenomenon in which heat is applied or transferred is expressed as "applying hot heat" or "transferring hot heat", and a phenomenon opposite to the phenomenon, i.e., a phenomenon in which heat is absorbed is expressed as "applying cold heat" or "transferring cold heat".

In addition, the thermal feedback in the present specification may further include thermal grill feedback in addition to the hot feedback and the cold feedback. When the hot heat and the cold heat are applied at the same time, a user perceives a pain sensation instead of individually perceiving a hot sensation and a cold sensation. The pain sensation is referred to as a so-called thermal grill illusion (TGI) (hereinafter, referred to as a "thermal pain sensation"). That is, thermal grill feedback means thermal feedback in which a combination of hot heat and cold heat is applied, and may be provided mainly by concurrently outputting the hot feedback and the cold feedback. In addition, the thermal grill feedback may be referred to as "thermal pain sensation feedback" in terms of providing a sensation close to pain Herein, the multimedia content may include various kinds of content including a video, a game, a virtual reality application, an augmented reality application, and an object recognition application.

In general, the multimedia content is provided to a user mainly in accordance with an audiovisual expression form based on an image and a voice. However, in the present invention, a thermal expression based on the above-mentioned thermal feedback may be included as an essential expression form.

Meanwhile, the "reproduction" of multimedia content should be interpreted to include all operations of executing and representing the multimedia content to a user. Therefore, the term "reproduction" in the present specification should be interpreted to include not only an operation of simply playing a video through a media player but also all operations of executing a game program, a training program, a virtual reality application, an augmented reality application, an object recognition application, and the like.

1.2. Configuration of Thermal Experience Providing System

FIG. 1 is a block diagram illustrating a configuration of the thermal experience providing system according to the exemplary embodiment of the present invention.

Referring to FIG. 1, the thermal experience providing system 1000 may include a content reproduction device 1200 and a feedback device 1600.

The content reproduction device 1200 may reproduce multimedia content and output an image or a voice according to reproduction of content, and the feedback device 1600 may output thermal feedback according to reproduction of content. That is, the content reproduction device 1200 and the feedback device 1600 may be communicatively connected, and the feedback device 1600 may acquire information for outputting thermal feedback from the content reproduction device 1200. For example, the content reproduction device 1200 may decode video content including video data, audio data, and thermal feedback data and may generate an image signal, an audio signal, and a thermal feedback signal according to the decoded video content. In an example, when thermal events occur during the reproduction of the multimedia content, the content reproduction device 1200 may generate a thermal feedback signal corresponding to the thermal event. In this case, when a type and intensity of a first thermal event of the thermal events are different from a type and intensity of a second thermal event of the thermal events, thermal feedback signals corresponding to the thermal events may also be different from each other. That is, a thermal event signal may be determined by a thermal event.

In addition, the content reproduction device 1200 may output an image and a voice according to an image signal and an acoustic signal, may transfer a thermal feedback signal to the feedback device 1600, and the feedback device 1600 may receive the thermal feedback signal to output thermal feedback.

Hereinafter, each element of the thermal experience providing system 1000 will be described in more detail.

1.2.1. Feedback Device

The feedback device 1600 may output thermal feedback according to multimedia reproduction.

Figure 2:
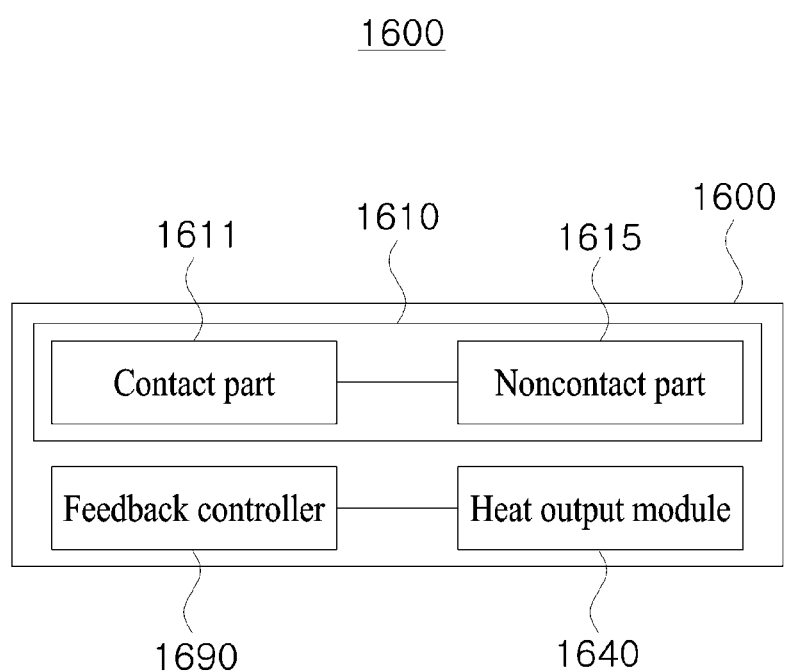
FIG. 2 is a block diagram illustrating a configuration of a feedback device according to an exemplary embodiment of the present invention.

FIG. 2 is a block diagram illustrating a configuration of the feedback device according to the exemplary embodiment of the present invention.

Referring to FIG. 2, the feedback device 1600 may include a casing 1610, a heat output module 1640, and a feedback controller 1690.

The casing 1610 forms an external appearance of the feedback device 1600 and accommodates elements such as the heat output module 1640 and the feedback controller 1690 therein. Accordingly, the accommodated elements may be protected from an external impact or the like by the casing 1610.

In an exemplary embodiment, the casing 1610 may include at least one member and may have various shapes. For example, the casing 1610 may include at least one member of a cylindrical member in which the casing 1610 extends in a cylindrical shape in one direction, a stick member in which the casing 1610 extends in another shape rather than the cylindrical shape, an additional member directly or indirectly connected to other members constituting the casing 1610, a disc-shaped member, and a ring member having an empty space therein (or, a half ring member having a non-closed loop shape).

In addition, the casing 1610 may have various shapes for use of content to be reproduced, such as a pad shape (or a joystick shape), a handle shape, a gun shape, a trackball shape, and a glove shape, usable mainly with both hands.

In addition, the casing 1610 may have a cavity extending to pass through a member included in the casing 1610.

Furthermore, the casing 1610 may have a recess in which a partial region thereof is recessed. As will be described below, waste heat may be dissipated from the cavity and/or the recess according to exemplary embodiments.

In an exemplary embodiment, when transferred heat is absorbed by the casing 1610, an exothermic or endothermic effect may be lowered. Thus, it is preferable that the casing 1610 is made of a material having an appropriate thickness and thermal conductivity. A thickness of the casing 1610 may be properly determined in consideration of difficulty in ensuring sufficient rigidity when the thickness is too small and difficulty in dissipating heat when the thickness is too large. Specifically, the casing 1610 may be made of a metal material, a resin material, or the like, which is capable of ensuring rigidity at the appropriate thickness as described above and has high thermal conductivity.

The casing 1610 may include a contact part 1611 and a noncontact part 1615. The contact part 1611 may indicate a region with which a user comes into contact when content is reproduced, and the noncontact part 1615 may indicate a region with which a user does not come into contact when the content is reproduced. That is, the noncontact part 1615 does not mean a region which does not come into contact with a user's body (i.e., a hand or a foot). Although the noncontact part 1615 intentionally comes into contact with the user's body, the noncontact part 1615 may mean a region in which the user's body does not come into contact with the feedback device 1600 according to a use method by which a user uses content when the content is reproduced (for example, a desired use method by which the user uses the feedback device 1600 described in a manual of the feedback device 1600). For example, when the content is reproduced, a region with which the user comes into contact in order to move the feedback device 1600 may be referred to as the contact part 1611, and a region with which the user does not come into contact although the feedback device 1600 is moved may be referred to as the noncontact part 1615.

In addition, in some cases, the contact part 1611/noncontact part 1615 may be expressed through various names, such as a grip part/non-grip part, a hold part/non-hold part, and an operation part/non-operation part.

Positions of the contact part 1611 and the noncontact part 1615 may be determined according to a shape of the feedback device 1600.

For example, when the feedback device 1600 has a pad shape, the contact part 1611 may be a surrounding region of a button of the feedback device 1600, and the noncontact part 1615 may be a central region or a rear region of the feedback device 1600.

In another example, when the feedback device 1600 has a gun shape, the contact part 1611 may be a trigger and/or a grip region of the feedback device 1600, and the noncontact part 1615 may be a barrel region.

In addition, the contact part 1611 and the noncontact part 1615 may be made of different members and may be positions in different regions of the same member.

Furthermore, the contact part 1611 and the noncontact part 1615 may or may not be distinguished externally. Shapes of the casing 1610, the contact part 1611, and the noncontact part 1615 will be described in detail with reference to FIGS. 11 to 20.

In addition, in an exemplary embodiment, the contact part 1611 and the noncontact part 1615 may be made of different materials. For example, in order to facilitate an easy grip for a user, the contact part 1611 may be formed of a material having a high frictional force (for example, rubber or urethane) or may have a slip-resistant shape (for example, an uneven shape or the like). Furthermore, the contact part 1611 may be made of a material which absorbs perspiration generated from a user's skin well.

A contact surface 1641 of the heat output module 1640 to be described later may be formed in the contact part 1611.

In addition, a heat dissipation unit may be formed in the noncontact part 1615. The heat dissipation unit may be configured to dissipate waste heat generated in the heat output module 1640 to the outside of the feedback device 1600. Herein, the waste heat may refer to the remaining heat excluding heat which is used to provide a thermal experience to the user among heat generated in the feedback device 1600. For example, the waste heat may include residual heat remaining in the feedback device 1600 after thermal feedback is output in the heat output module 1640. The heat dissipation unit will be described in more detail with reference to FIG. 10 and FIGS. 21 to 32.

The heat output module 1640 may output thermal feedback. The thermal feedback may be output in such a manner that when power applied to the heat output module 1640 including the contact surface 1641 in contact with a user's body and the thermoelectric element connected to the contact surface 1641, the heat output module 1640 applies hot heat or cold heat generated in the thermoelectric element to the user's body through the contact surface 1641.

The heat output module 1640 may output the thermal feedback by performing an exothermic operation, an endothermic operation, or a thermal grill operation according to a thermal feedback signal received from the content reproduction device 1200 through a communication module 1620. A user may experience the thermal experience through the output thermal feedback.

The feedback controller 1690 may control overall operation of the feedback device 1600. For example, the feedback controller 1690 may receive a thermal feedback signal from the content reproduction device 1200 through the communication module 1620 and may apply power to the thermoelectric element of the heat output module 1640 such that thermal feedback is output according to the thermal feedback signal.

The feedback controller 1690 may be implemented as a central processing unit (CPU) or a device similar to the CPU according to hardware, software, or combination thereof. Hardware-wise, the feedback controller 1690 may be provided in the form of an electronic circuit configured to perform a control function by processing an electrical signal. Software-wise, the feedback controller 1690 may be provided in the form of a program or a code configured to drive a hardware circuit.

Figure 3:
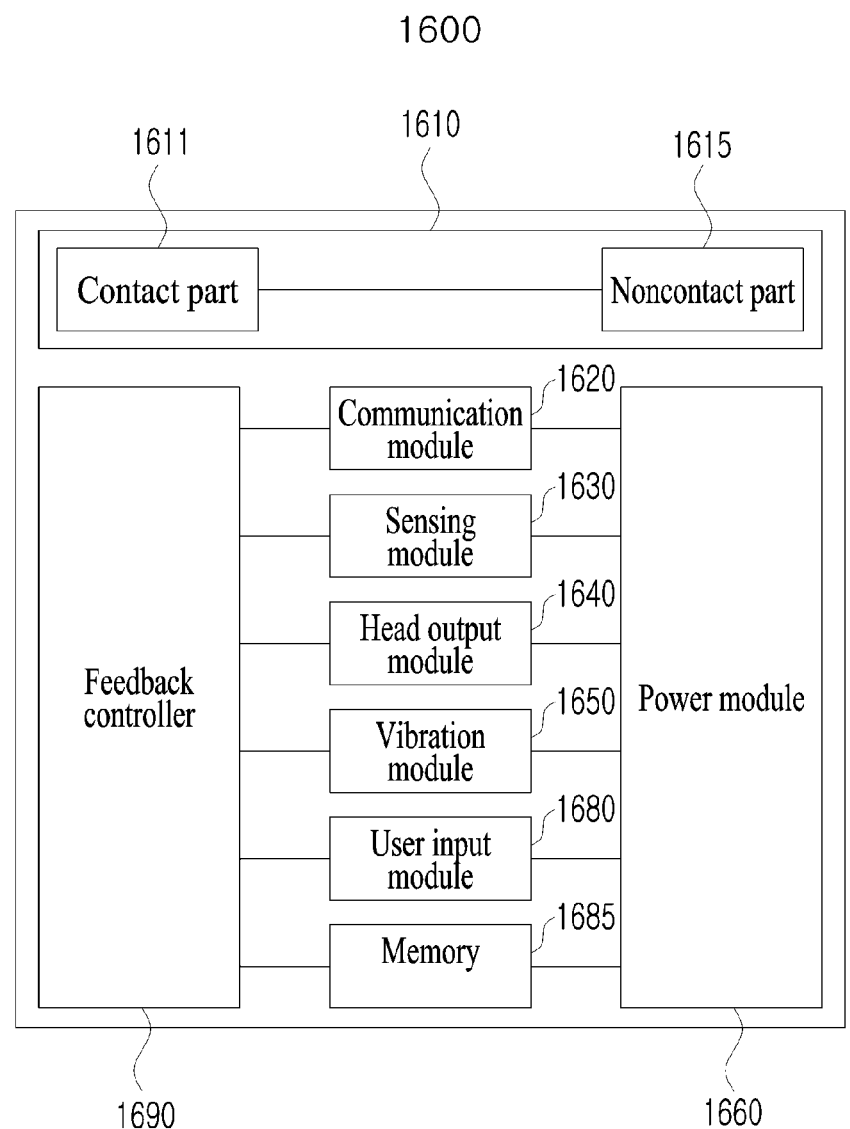
FIG. 3 is a block diagram illustrating a configuration of a feedback device according to another exemplary embodiment of the present invention.

FIG. 3 is a block diagram illustrating a configuration of a feedback device according to another exemplary embodiment of the present invention.

Referring to FIG. 3, a feedback device 1600 as described with reference to FIG. 2 may further include a communication module 1620, a sensing module 1630, a vibration module 1650, a power module 1660, a user input module 1680, and a memory 1685 in addition to a casing 1610, a heat output module 1640, and a feedback controller 1690.

The communication module 1620 performs communication with an external device. The feedback device 1600 may transmit and receive data to and from the content reproduction device 1200 through the communication module 1620. For example, the feedback device 1600 may receive a thermal feedback signal from the content reproduction device 1200 through the communication module 1620.

The communication module 1620 is mainly classified into a wired type and a wireless type. Since the wired type and the wireless type each have advantages and disadvantages, in some cases, one feedback controller 1600 may be provided with both the wired type and the wireless type.

In the case of the wired type, universal serial bus (USB) communication is a typical example, but other methods are possible. For example, in the case of a wired type, the communication module 1210 may include a wired communication interface such as RS232, RS485, RS422, or the like.

In the case of the wireless type, a wireless personal area network (WPAN) based communication method such as Bluetooth, Bluetooth low energy (BLE), or ZigBee may be used. However, since a wireless communication protocol is not limited thereto, the wireless type communication module 1620 may use a wireless local area network (WLAN)-based communication method such as Wi-Fi or other known communication methods. A proprietary protocol developed by the manufacturer of the feedback device 1600 may also be used as a wired/wireless communication protocol The sensing module 1630 may sense a variety of information related to the feedback device 1600. Representative examples of the sensing module 1630 include an attitude sensor configured to sense an attitude of the feedback device 1600 and a motion sensor configured to sense motion of the feedback device 1600. In addition, the sensing module 1630 may include a biosensor configured to sense a body signal of a user. A gyro sensor and/or an acceleration sensor may be used as the attitude sensor or the motion sensor. The biosensor may include a temperature sensor configured to sense a body temperature of a user or an electrocardiogram sensor configured to sense an electrocardiogram. In addition, as described above, the sensing module 1630 may sense whether the content reproduction device 1200 is mounted on the mounting portion 1611.

The vibration module 1650 may output vibration feedback. Vibration feedback may function to further improve a user's immersion in a game together with thermal feedback. For example, the vibration feedback may be generated when a character in a game is caught in an explosion scene, or when a player falls from a high position and is shocked. On the other hand, as will be described later, the vibration feedback and the thermal feedback may interwork with each other.

The user input module 1680 may obtain user input from a user. For example, when the feedback device 1600 is a game pad type having a pad shape, the user input is mainly a user command for a game. For example, the user input may be a command for character control, menu selection, or the like in the game.

In another example, the user input may be a user command for establishing a communication channel with the content reproduction device 1200. The user input module 1680 may be mainly a button or a stick, and a user may input a user input by pressing the button or moving the stick in a specific direction. Of course, the user input module 1680 is not limited to the forms of the above-described examples.

The memory 1685 may store a variety of information. The memory 1685 may temporarily or semipermanently store data. Examples of the memory 1685 may include a hard disk drive (HDD), a solid state disk (SSD), a flash memory, a read-only memory (ROM), a random access memory (RAM), and the like. The memory 1685 may be provided as a form embedded in the feedback device 1600 or as a form attachable to or detachable from the feedback device 1600.

The memory 1685 may store an operation system (OS) for driving the feedback device 1600 or a variety of data required or used for operating the feedback device 1600.

The power module 1660 supplies power required for operating the feedback device 1600. The power module 1660 may supply power received from the outside to each element required for operating the feedback device 1600 or may store and supply electric energy to each element like a battery. For example, when the feedback device 1600 includes a heat dissipation fan, the power module 1660 may supply power required for driving the heat dissipation fan to the heat dissipation fan.

In an exemplary embodiment, the power module 1660 may receive power from an external device through a wired port such as a USB port. Of course, the wired port includes other ports capable of receiving power in addition to the USB port. In an exemplary embodiment, when the casing 1610 has a recess, the wired port, such as the USB port, may be disposed in the recess.

In addition, the power module 1660 may wirelessly receive power from the external device through a wireless charging port. For example, the power module 1660 may receive power from a power module 1250 of the content reproduction device 1200 through the wired or wireless port. The power received from the external device may be stored in a battery of the power module 1660.

The feedback controller 1690 may perform overall control of the feedback device 1600. For example, the feedback controller 1690 may transmit user input which is input through the user input module 1680 or attitude information of the feedback device 1600 sensed by the sensing module 1630 to the content reproduction device 1200 by using the communication module 1620. Alternatively, the feedback controller 1690 may receive a vibration signal from the content reproduction device 1200 through the communication module 1620 and may allow a vibration sensor to generate vibration feedback. In addition, the feedback controller 1690 may receive a thermal feedback request signal from the content reproduction device 1200 through the communication module 1620 and may control the heat output module 1640 to generate thermal feedback.

Furthermore, when the feedback device 1600 includes a heat dissipation unit, the feedback controller 1690 may drive the heat dissipation unit. For example, when the feedback device 1600 includes the heat dissipation fan, the feedback controller 1690 may drive the heat dissipation fan and adjust a level of the heat dissipation fan.

2. Heat Output Module and Heat Dissipation Member 2.1. Overview of Heat Output Module A heat output module 1640 may output thermal feedback for transferring hot heat and cold heat to a user by performing an exothermic operation, an endothermic operation, or a thermal grill operation. In a thermal experience providing system 1000, when a feedback device 1600 receives a thermal feedback signal, the heat output module 1640 mounted on the feedback device 1600 may output thermal feedback to allow the thermal experience providing system 1000 to provide thermal experience to a user.

In order to perform the above-described exothermic operation, endothermic operation, or thermal grill operation, the heat output module 1640 may use a thermoelectric element such as a Peltier element.

The Peltier effect is a thermoelectric phenomenon discovered by Jean Peltier in 1834. According to the Peltier effect, when an electric current is made to flow through a junction between dissimilar metals, an exothermic reaction occurs at one side of the junction and an endothermic reaction occurs at the other side of the junction according to a current direction. The Peltier element is an element which causes such a Peltier effect. The Peltier element was originally made of a joined body of dissimilar metals such as bismuth and antimony. However, recently, the Peltier element has been manufactured through a method of disposing N-P semiconductors between two metal plates so as to have higher thermoelectric efficiency.

When a current is applied to the Peltier element, heat generation and heat absorption may instantaneously occur at both metal plates, a switching between the heat generation and the heat absorption may be made according to a current direction, and a degree of the heat generation or absorption may be relatively precisely adjusted according to a current amount. Thus, the Peltier element is suitable to be used for an exothermic operation or an endothermic operation for thermal feedback. In particular, recently, as a flexible thermoelectric element has been developed, it has been possible to manufacture the flexible thermoelectric element in a form with which a user's body easily comes into contact therewith such that commercial availability of the flexible thermoelectric element as the feedback device 1600 has been increasing.

Therefore, as electricity is applied to the above-described thermoelectric element, the heat output module 1640 may perform an exothermic operation or an endothermic operation.

Physically, an exothermic reaction and an endothermic reaction concurrently occur in the thermoelectric element to which electricity is applied. However, in the present specification, in the case of the heat output module 1640, an operation in which a surface in contact with a user's body generates heat is defined as an exothermic operation, and an operation in which the surface in contact with the user's body absorbs heat is defined as an endothermic operation. For example, the thermoelectric element may be manufactured by disposing N-P semiconductors on a substrate 1642. When a current is applied to the thermoelectric element, heat generation occurs at one side of the thermoelectric element, and heat absorption occurs at the other side of the thermoelectric element. When one side of the thermoelectric element facing the user's body is defined as a front side and a side opposite to the one side is defined as a rear side, an operation in which the heat generation occurs at the front side and an operation in which the heat absorption occurs at the rear side may be defined as an operation in which the heat output module 1640 performs an exothermic operation. On the contrary, an operation in which the heat absorption occurs at the front side and the heat generation occurs at the rear side may be defined as an operation in which the heat output module 1640 performs an endothermic operation.

In addition, since a thermoelectric effect is induced by electric charges flowing in the thermoelectric element, it is possible to describe electricity inducing the exothermic operation or the endothermic operation of the heat output module 1640 in terms of a current. In the present specification, however, for convenience of description, description will be made mainly in terms of a voltage. This is merely for convenience of description, and inventive thinking is not required for a person having ordinary skill in the art to which the present invention belongs (hereinafter referred to as "a person skilled in the art") to interpret the exothermic operation or the endothermic operation in terms of a current. Therefore, the present invention is not limited to expression in terms of the voltage.

2.2. Configuration of Heat Output Module

Figure 4:
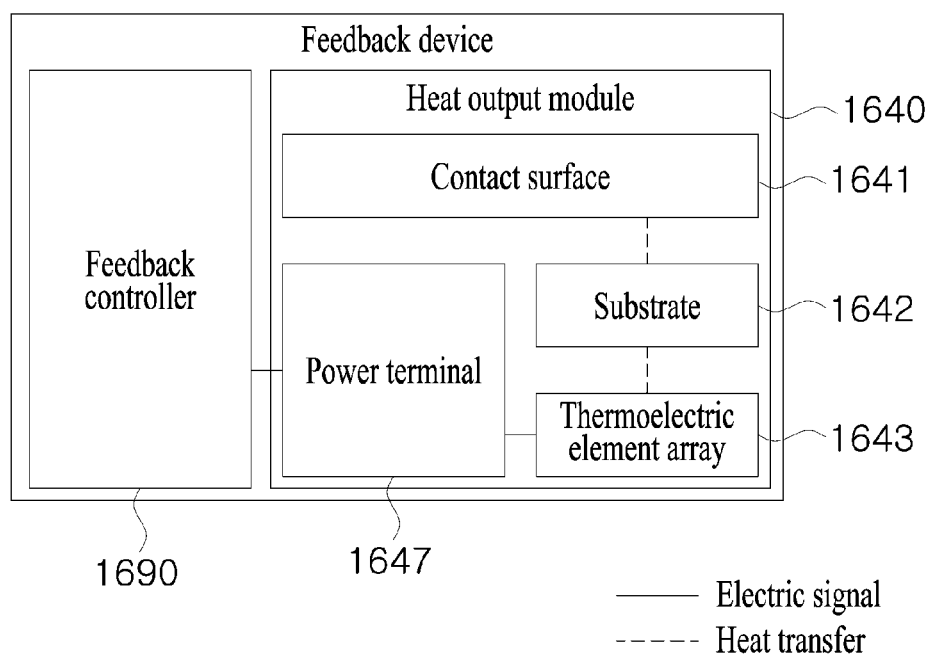
FIG. 4 is a block diagram illustrating a configuration of a feedback device according to an exemplary embodiment of the present invention.

FIG. 4 is a block diagram illustrating a configuration of a feedback device according to an exemplary embodiment of the present invention.

Referring to FIG. 4, a feedback device 1600 includes a feedback controller 1690 and a heat output module 1640.

According to the exemplary embodiment of the present invention, the feedback controller 1690 may be a configuration distinguished from the heat output module 1640 or may be included in the heat output module 1640. In addition, the present invention is not limited thereto, and when the feedback controller 1690 exists outside the heat output module 1640, a separate feedback controller may exist in the heat output module 1640 independently from the feedback controller 1690. In the present specification, for convenience of description, descriptions assume that the feedback controller 1690 is distinguished from the heat output module 1640.

The heat output module 1640 may include a contact surface 1641, a substrate 1642, a thermoelectric element array 1643 disposed on the substrate 1642, and a power terminal 1649 configured to apply power to the heat output module 1640.

The contact surface 1641 comes into direct contact with a user's body to transfer hot heat or cold heat generated by the heat output module 1640 to a user's skin. In other words, a portion of the feedback device 1600 which comes into direct contact with the user's body may be the contact surface 1641. For example, the contact surface 1641 may be formed in at least a portion of a contact part 1611 of the feedback device 1600. However, the present invention is not limited thereto, and the contact surface 1641 may be formed on the entirety of the contact part 1611.

In an exemplary embodiment, the contact surface 1641 may be provided as a layer directly or indirectly attached to an outer surface (facing a user's body) of the thermoelectric element array 1643 configured to perform an exothermic operation or an endothermic operation in the heat output module 1640. The contact surface 1641 having such a type may be disposed between the thermoelectric element array 1643 and a user's skin to perform a heat transfer. To this end, the contact surface 1641 may be made of a material having high thermal conductivity such that heat is well transferred from the thermoelectric element array 1643 to the user's body. In addition, the contact surface 1641 having a layer type may also have a function of protecting the thermoelectric element array 1643 from an external impact by preventing the thermoelectric element array 1643 from being directly exposed to the outside.

Meanwhile, it has been described that the contact surface 1641 is a separate configuration disposed on the outer surface of the thermoelectric element array 1643, and alternatively, the outer surface itself of the thermoelectric element array 1643 may become the contact surface 1641. In other words, the whole or a portion of a front surface of the thermoelectric element array 1643 may become the contact surface 1641.

The substrate 1642 functions to support a thermoelectric couple unit 1645 and is made of an insulating material. For example, ceramic may be selected as a material of the substrate 1642. The substrate 1642 may have a flat plate shape, but it is not necessarily limited thereto.

The substrate 1642 may be made of a flexible material so as to have flexibility universally available to various types of the feedback devices 1600 having the contact surface 1641 with various shapes. For example, in the feedback device 1600 having a gaming controller type, portions of the feedback controller, with which a hand of a user comes into contact, mostly have a curved shape. In order to use the heat output module 1640 at the portion having the curved shape, it may be important for the heat output module 1640 to have flexibility. To this end, examples of a flexible material used in the substrate 1642 may include glass fiber or flexible plastic.

The thermoelectric element array 1643 may perform a thermoelectric operation including an exothermic operation, an endothermic operation, and a thermal grill operation. The thermoelectric element array 1643 includes a plurality of thermoelectric couple units 1645 disposed on the substrate 1642. As the thermoelectric couple units 1645, a pair of different metals (for example, bismuth and antimony) may be used, but a pair of N-type and P-type semiconductors may be mainly used.

In the thermoelectric couple unit 1645, one ends of the pair of semiconductors are electrically connected to each other, and the other ends thereof are electrically connected to adjacent thermoelectric couple unit 1645. Electrical connection between the pair of semiconductors 1645a and 1645b or electrical connection with adjacent semiconductors is achieved by a conductor member 1646 disposed on the substrate 1642. The conductor member 1646 may be a lead wire or an electrode made of copper, silver or the like.

The thermoelectric couple units 1645 may be electrically connected in series. The thermoelectric couple units 1645 connected in series may constitute a thermoelectric couple group 1644. The thermoelectric couple groups 1644 may constitute the thermoelectric element array 1643.

The power terminal 1649 may apply power to the heat output module 1640. The thermoelectric element array 1643 may generate or absorb heat according to a voltage value and a current direction of power applied to the power terminal 1649. More specifically, two power terminals 1649 may be connected to one thermoelectric couple group 1644. Accordingly, when a plurality of thermoelectric couple groups 1644 are provided, two power terminals 1649 may be disposed for each thermoelectric couple group 1644. Due to such a connection method, a voltage value or a current direction may be individually controlled for each thermoelectric couple group 1644, and thus, it is possible to adjust whether to perform any one of heat generation and heat adsorption and to adjust a degree of the heat generation or the heat absorption.

As will also be described later, the power terminal 1649 receives an electrical signal output by the feedback controller 1690, and as a result, the feedback controller 1690 may adjust the direction or intensity of an electrical signal and may control an exothermic operation and an endothermic operation of the heat output module 1640. Furthermore, when the plurality of thermoelectric couple groups 1644 are provided, an electric signal applied to each power terminal 1649 may be independently adjusted to individually control each thermoelectric couple group 1644.

The feedback controller 1690 may apply an electric signal to the thermoelectric element array 1643 through the power terminal 1649. Specifically, the feedback controller 1690 may receive information on thermal feedback from a controller 1290 of a content reproduction device 1200 through a communication module 1620, may analyze the information on the thermal feedback to determine a type or strength of the thermal feedback, may generate and apply an electric signal according to a determination result to the power terminal 1649, and thus may allow the thermoelectric element array 1643 to output the thermal feedback.

To this end, the feedback controller 1690 may operate and process a variety of information and may output an electric signal to the thermoelectric element array 1643 according to a processing result, thereby controlling operation of the thermoelectric element array 1643. Thus, the feedback controller 1690 may be implemented as a computer or a device similar to the computer according to hardware, software, or a combination thereof. Hardware-wise, the feedback controller 1690 may be provided in the form of an electronic circuit configured to perform a control function by processing an electrical signal. Software-wise, the feedback controller 1690 may be provided in the form of a program or a code configured to drive a hardware circuit.

A plurality of heat output modules 1640 as described above may be provided in the feedback device 1600. For example, when the contact part of the feedback device 1600 is divided into a plurality of contact parts, the heat output module 1640 may be mounted on each of the plurality of contact parts. As described above, when the plurality of heat output modules 1640 are provided in one feedback device 1600, the feedback controller 1690 may integrally control all the heat output modules 1640, or the feedback controller 1690 may be provided in each of the heat output modules 1640. In addition, when a plurality of feedback devices 1600 are provided in a thermal experience providing system 1000, one or more heat output modules 1640 may be disposed in each of the feedback devices 1600.

2.3. Type and Example of Heat Output Module

Some representative types of the heat output module 1640 will be described based on the description of the configuration of the heat output module 1640.

Figure 5:
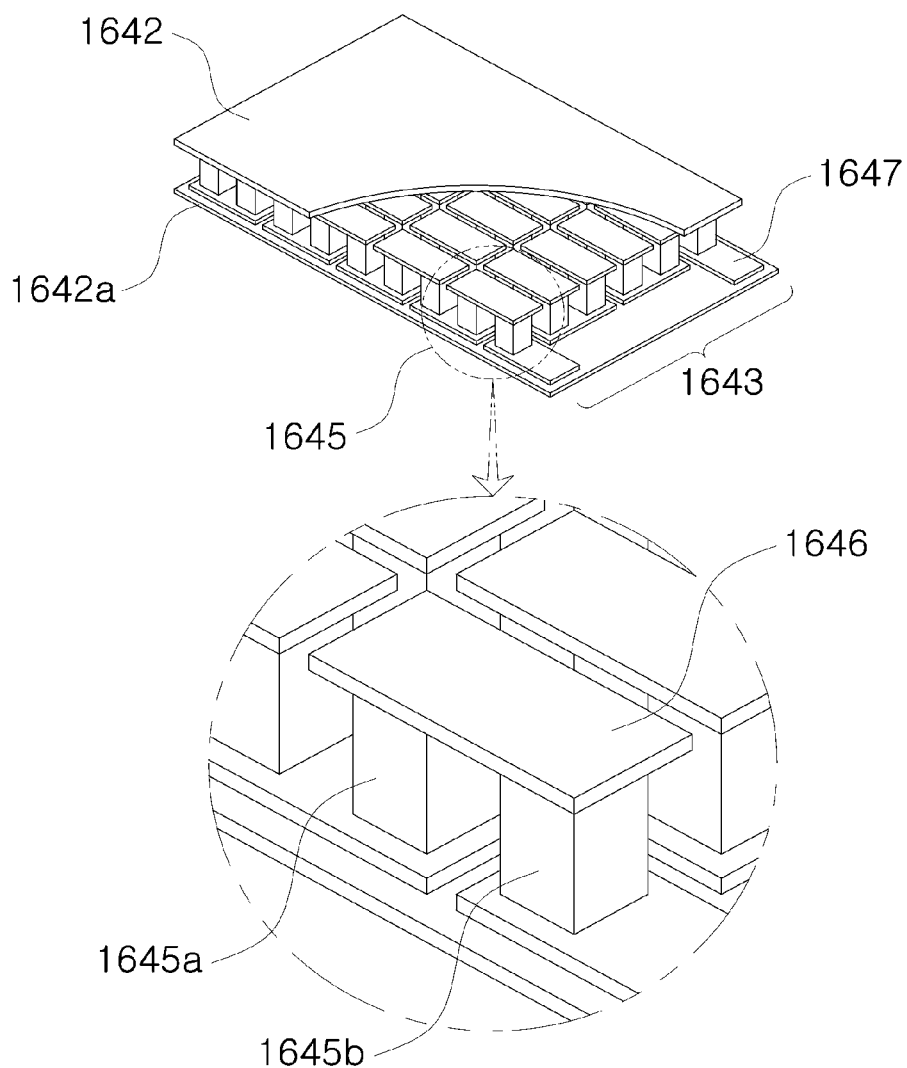
FIG. 5 is a view illustrating one type of a heat output module according to an exemplary embodiment of the present invention.

FIG. 5 is a view illustrating one type of a heat output module according to an exemplary embodiment of the present invention.

Referring to FIG. 5, in one type of a heat output module 1640, a pair of substrates 1642 and 1642a are provided to face each other. A contact surface 1641 may be positioned outside one substrate 1642 of the two substrates 1642 and 1642a to transfer heat generated by the heat output module 1640 to a user's body. In addition, when a flexible substrate 1642 is used as the substrates 1642 and 1642a, the heat output module 1640 may have flexibility.

A plurality of thermoelectric couple units 1645 are positioned between the substrates 1642 and 1642a. Each of the thermoelectric couple units 1645 includes a semiconductor pair of an N-type semiconductor and a P-type semiconductor. In each of the thermoelectric couple units 1645, one ends of the N-type semiconductor and the P-type semiconductor are electrically connected to each other through a conductor member 1646. In addition, unit elements are electrically connected in such a manner that the other end of an N-type semiconductor and the other end of a P-type semiconductor in any thermoelectric couple unit 1645 are electrically connected to the other end of a P-type semiconductor and the other end of an N-type semiconductor of adjacent thermoelectric couple units 1645, respectively, through the conductor members 1646. Therefore, the connected unit elements are connected in series to one thermoelectric couple group 1644. In the present type, the entirety of a thermoelectric element array 1643 may include one thermoelectric couple group 1644, and all the thermoelectric couple units 1645 are connected in series between power terminals 1649 so that the heat output module 1640 may perform the same operation throughout an entire surface thereof. That is, when power is applied to the power terminal 1649 in one direction, the heat output module 1640 may perform an exothermic operation. When power is applied in a direction opposite to one direction, the heat output module 1640 may perform an endothermic operation.

Figure 6:
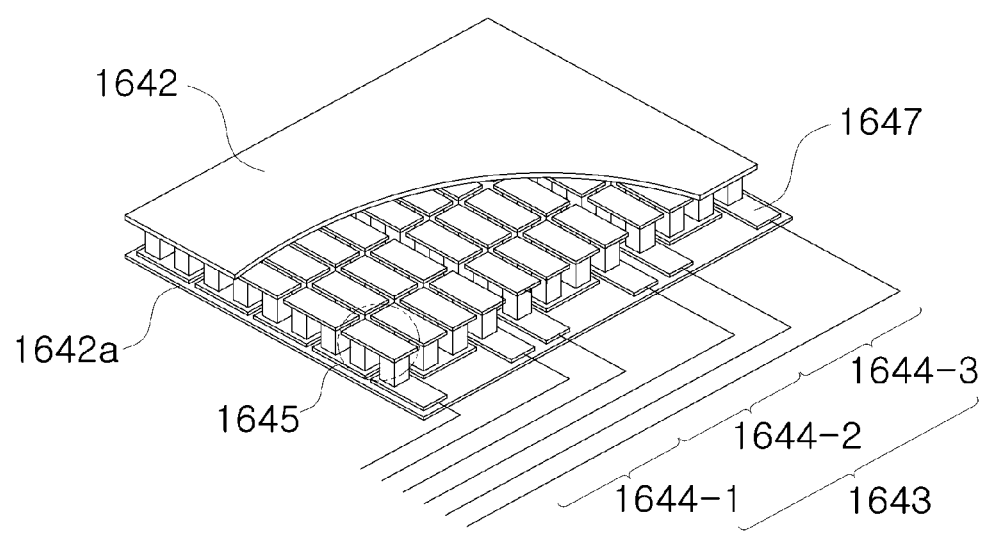
FIG. 6 is a view illustrating another type of a heat output module according to an exemplary embodiment of the present invention.

FIG. 6 is a view illustrating another type of a heat output module according to an exemplary embodiment of the present invention.

Referring to FIG. 6, another type of a heat output module 1640 is similar to one type described above. In the present type, a thermoelectric element array 1643 may include a plurality of thermoelectric couple groups 1644, and each of the thermoelectric couple groups 1644 may be connected to each power terminal 1649, thereby independently controlling each of the thermoelectric couple groups 1644. For example, currents in different directions may be applied to a first thermoelectic couple group 1644-1 and a second thermoelectric couple group 1644-2, thereby allowing the first thermoelectric couple group 1644-1 to perform an exothermic operation (wherein a current direction is referred to as a "forward direction"), and the second thermoelectric couple group 1644-2 to perform an endothermic operation (wherein a current direction is referred to as a "reverse direction"). In another example, voltages having different values may be applied to a power terminal of the first thermoelectric couple group 1644-1 and a power terminal of the second thermoelectric couple group 1644-2, thereby allowing the first thermoelectric couple group 1644-1 and the second thermoelectric couple group 1644-2 to perform different degrees of exothermic operations or endothermic operations.

Meanwhile, FIG. 6 illustrates that the thermoelectric couple groups 1644 are arranged in a one-dimensional array in the thermoelectric element array 1643. Alternatively, the thermoelectric couple groups 1644 may be arranged in a two-dimensional array. On the other hand, it has been described that the types of the heat output module 1640 use a pair of substrates 1642 and 1642a facing each other. Alternatively, a single substrate may be used.

The various types of the heat output module 1640 may be combined or modified within a range obvious to a person skilled in the art. For example, while it has been described that in each of the types of the heat output module 1640, the contact surface 1641 is formed on a front surface of the heat output module 1640 as a layer separately from the heat output module 1640, the front surface itself of the heat output module 1640 may become the contact surface 1641. For example, in one type of the heat output module 1640 described above, an outer surface of one substrate 1642 may become the contact surface 1641.

Figure 7:
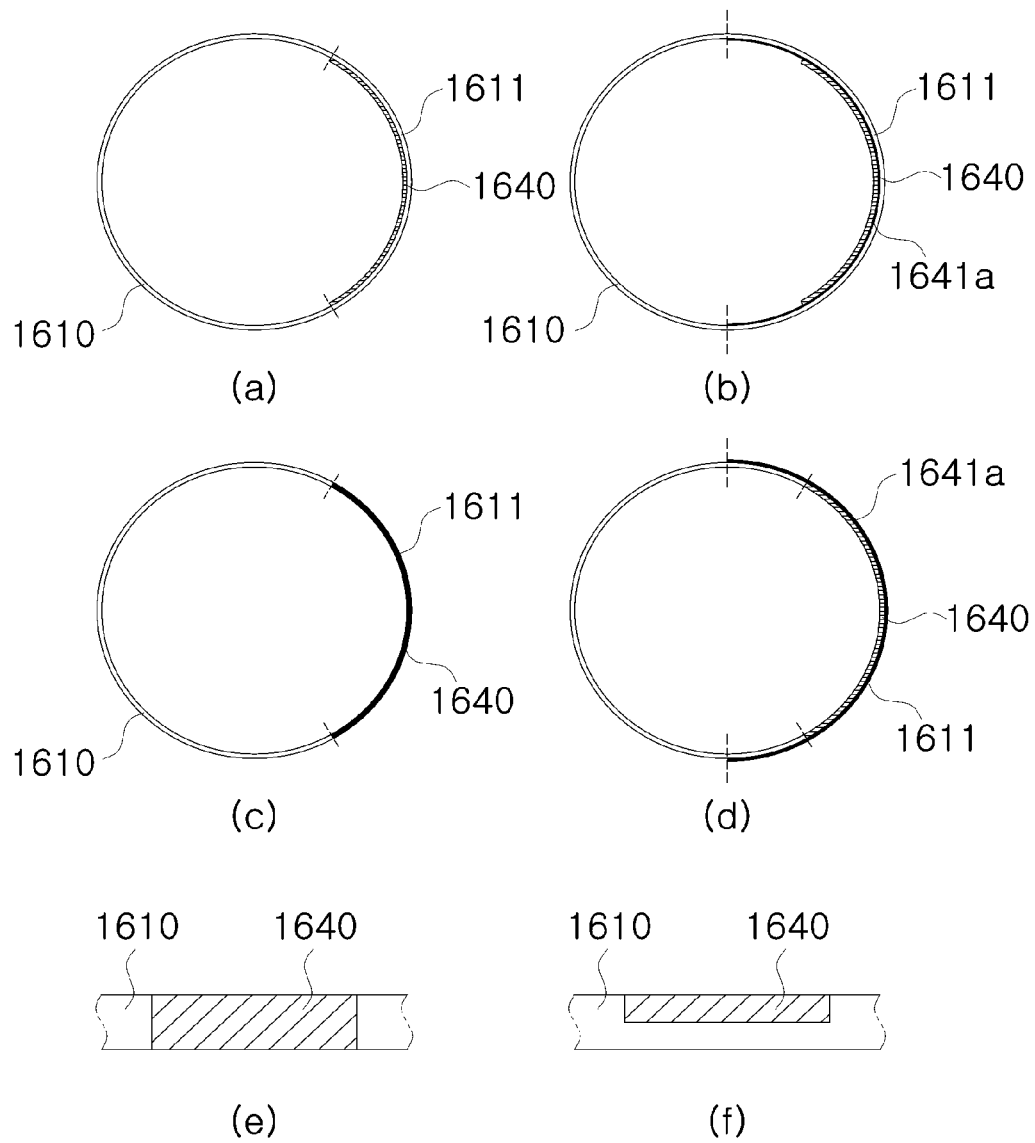
FIG. 7 is a view illustrating an example of a heat output module according to an exemplary embodiment of the present invention.

FIG. 7 is a view illustrating an example of a heat output module according to an exemplary embodiment of the present invention.

Referring to FIG. 7, (a) and (b) of FIG. 7 are cross-sectional views illustrating a case in which a heat output module 1640 is disposed on an inner surface of a casing 1610. (c) to (f) of FIG. 7 are cross-sectional views illustrating a case in which a heat output module 1640 is disposed on an outer surface of a casing 1610.

For convenience of description, in FIG. 7, an arrangement of the heat output module 1640 when the casing 1610 is a cylindrical member will be described with reference to FIG. 7. However, the present invention is not limited thereto, and content described with reference to FIG. 7 may be applied as it is even when the casing 1610 includes other members such as a stick member. In addition, the heat output module 1640 is illustrated in FIG. 7 as being formed in a portion of the casing 1610, but the present invention is not limited thereto, and the heat output module 1640 may be formed on the entirety of the casing 1610.

Referring to (a), the heat output module 1640 may be formed in a partial region of the inner surface of the casing 1610. In this case, the heat output module 1640 may be disposed on an inner surface of a contact part 1611 of an entire region of the casing 1610. Of course, the heat output module 1640 may not be positioned to exactly correspond to the contact part 1611, and a region corresponding to the contact part 1611 may be wider than a region in which the heat output module 1640 is disposed.

Referring to (b), the heat output module 1640 may be formed in a partial region of an inner surface of the casing 1610, and a heat-conductive layer 1641a may be formed between the heat output module 1640 and the casing 1610. Herein, the heat-conductive layer 1641a may have an area greater than that of the heat output module 1640 and may conduct heat generated in the heat output module 1640 to a region wider than the heat output module 1640. That is, the heat-conductive layer 1641a may be disposed on an inner surface of a contact part 1611 of an entire region of the casing 1610. Specifically, in the present invention, the heat output module 1640 may provide cold or hot stimulation to a user's hand which grips the contact surface 1611 of the casing 1610. However, heat is transferred between the heat output module 1640 and the casing 1610 in a state in which the heat output module 1640 and the casing 1610 are in close contact (surface contact) with each other in a surface-to-surface manner. Since the heat output module 1640 and the casing 1610 may not be in complete contact with each other microscopically, heat may not be smoothly transferred. To this end, in the present invention, the heat-conductive layer 1641a may be provided to improve and extend an effect of an exothermic or endothermic operation performed by the heat output module 1640. The heat-conductive layer 1641a is interposed between the heat output module 1640 and the casing 1610. As described above, a heat transfer effect may be decreased due to the heat output module 1640 and the casing 1610 not being in complete contact with each other. However, since the heat-conductive layer 1641a is interposed between the heat output module 1640 and the casing 1610, it is surely possible to realize close contact at both sides. As a result, of course, the heat transfer effect may be considerably improved.

In addition, when the heat output module 1640 is formed on the entire contact surface 1611, there may be some disadvantages in terms of efficiency due to excessive power consumption or the like. To this end, in the present invention, the heat-conductive layer 1641a may be formed to have an area greater than that of the heat output module 1640. Due to such a configuration, since an exothermic or endothermic effect may be extended by the heat-conductive layer 1641a, the area of the heat output module 1640 may be considerably reduced, thereby saving power consumed in the heat output module 1640 and decreasing volume and weight of the heat output module 1640.

Of course, the heat-conductive layer 1641a may be formed to have the same area as the heat output module 1640 according to a design.

In an exemplary embodiment, the heat-conductive layer 1641a may be a configuration separate from the contact surface 1641. In addition, the heat-conductive layer 1641a may replace the contact surface 1641. In this case, the heat-conductive layer 1641a may be provided as a layer directly or indirectly attached to an outer surface (facing a user's body) of a thermoelectric element array 1643 and may receive heat from the thermoelectric element array 1643.

In an exemplary embodiment, the heat-conductive layer 1641a may be made of any material without any particular limitation as long as the material is capable of conducting heat well. For example, the heat-conductive layer 1641a may be made of various materials such as a polymer material, a metal material or the like, which have high thermal conductivity. In addition, generally, the heat-conductive layer 1641a may be formed in a thin film shape, which is much thinner than the heat output module 1640.

Referring to (c), the heat output module 1640 may be formed in a partial region of an outer surface of the casing 1610.

That is, the heat output module 1640 may be exposed at the outer surface of the casing 1610. More specifically, a hole or a groove, which corresponds to a shape and an area of the heat output module 1640, may be formed in a wall of the casing 1610. Then, the heat output module 1640 may be inserted into the hole or the groove. In this case, a region corresponding to the hole or the groove may become a contact surface 1611 of the casing 1610.

In an exemplary embodiment, the heat output module 1640 may be provided in various types as shown in (e) to (f) according to a difference between a wall thickness of the casing 1610 and a thickness of the heat output module 1640.

(e) illustrates a case in which the wall thickness of the casing 1610 and the thickness of the heat output module 1640 are formed to be the same. In this case, a hole, which has a shape and an area corresponding to the shape and the area of the heat output module 1640, may be formed in a wall of the casing 1610 so that the heat output module 1640 may be inserted into the hole.

In addition, (f) illustrates a case in which the thickness of the heat output module 1640 is formed to be smaller than the wall thickness of the casing 1610. In this case, a groove, which has a shape and an area corresponding to the shape and the area of the heat output module 1640, may be formed in a wall of the casing 1610 so that the heat output module 1640 may be inserted into the groove. When the hole or the groove is formed in the casing 1610 as described above, the heat output module 1640 does not protrude outside the casing 1610. Thus, when a user grips the casing 1610, there may be little foreign body sensation. Of course, the present invention is not limited thereto, and the heat output module 1640 may be disposed on an outer surface of the casing 1610 without forming a hole or a groove in the casing 1610.

Referring to (d), the heat output module 1640 may be formed in a partial region of an outer surface of the casing 1610, and a heat-conductive layer 1641a may be formed on an outer surface of the heat output module 1640. In this case, the heat-conductive layer 1641a may be disposed on an outer surface of a contact part 1611.

For example, as shown in (d), a hole or a groove, which has a shape and an area corresponding to a shape and an area of the heat output module 1640, may be formed in a wall of the casing 1610. Then, the heat output module 1640 may be inserted into the hole or the groove. In this case, the heat-conductive layer 1641a may have an area greater than that of the heat output module 1640. The heat-conductive layer 1641a may be formed on an outer surface of the heat output module 1640 to cover a partial region of the casing 1610 and the heat output module 1640.

However, the present invention is not limited thereto, and the heat output module 1640 and the heat-conductive layer 1641a may have other exemplary embodiments different from that illustrated in (d). For example, the heat output module 1640 may be formed on the outer surface of the casing 1610, and the heat-conductive layer 1641a may cover the outer surface of the heat output module 1640 and a partial region of the casing 1610.

Of course, the heat-conductive layer 1641a may be formed to have the same area as the heat output module 1640 according to a design.

Figure 8:
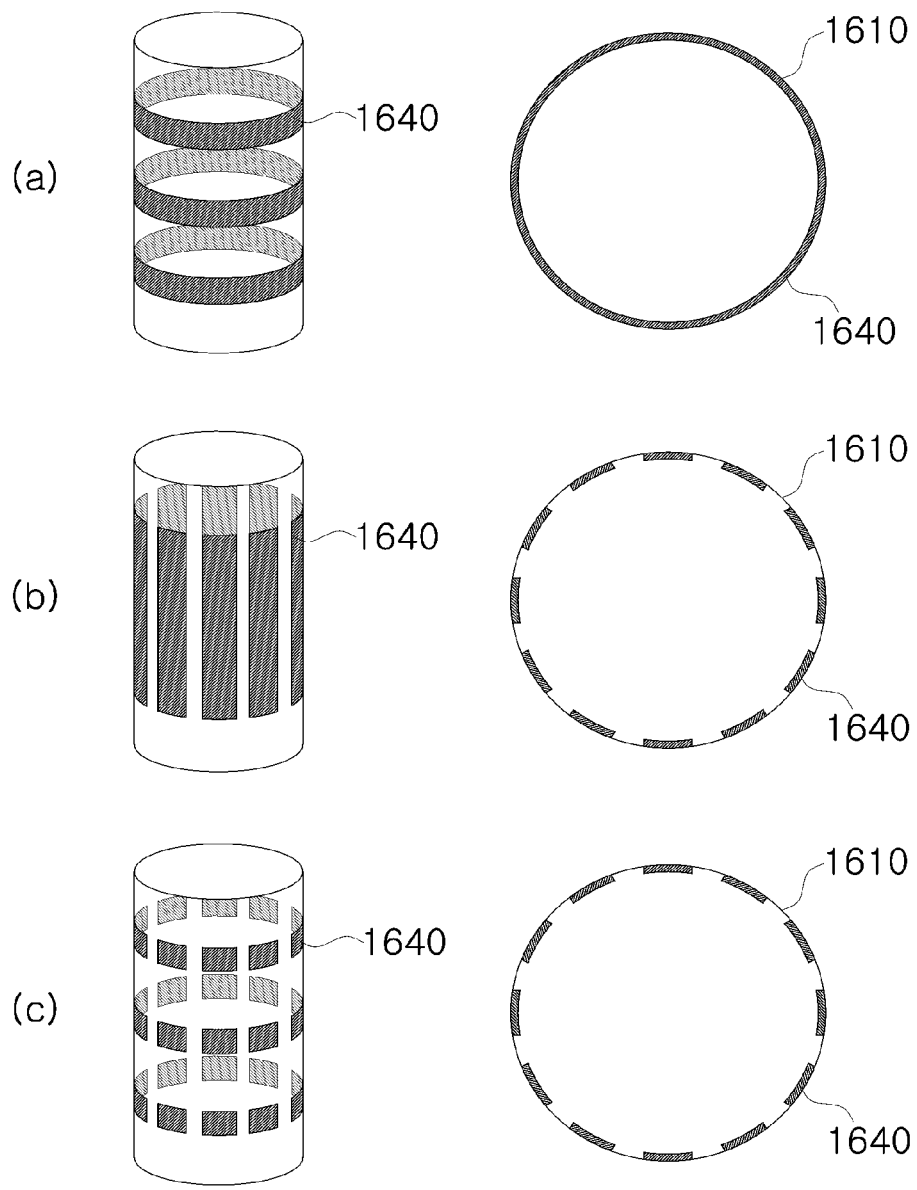
FIG. 8 is a view illustrating various forms of arranging a heat output module according to an exemplary embodiment of the present invention.

FIG. 8 is a view illustrating various forms of arranging a heat output module according to an exemplary embodiment of the present invention.

Referring to FIG. 8, as shown in (a), a heat output module 1640 may be disposed in an entire region of a casing 1610. For example, as shown in (a), the heat output module 1640 may be formed in an entire region in a circumferential direction of the casing 1610 and may be divided into pieces in a lengthwise direction of the casing 1610.

In addition, as shown in (b), a heat output module 1640 may be formed in an entire region in a lengthwise direction of a casing 1610 and may be divided into pieces in a circumferential direction of the casing 1610.

Furthermore, as shown in (c), a heat output module 1640 may be divided into pieces in both of a circumferential direction and a lengthwise direction of a casing 1610.

In an exemplary embodiment, as described with reference to (a), (b), and (c) of FIG. 8, when the heat output module 1640 is disposed in the entire region of the casing 1610 and a heat-conductive layer 1641a is disposed in a wider region compared to the heat output module 1640, the heat-conductive layer 1641a may be formed in a shape covering the entirety of the casing 1610. In other words, even when the heat output module 1640 is divided and disposed into pieces, the heat-conductive layer 1641a may extend an exothermal or endothermic effect, thereby providing thermal feedback through the entire region of the casing 1610. In this case, the casing 1610 may include a contact part 1611 and may not include a noncontact part 1615.

Of course, thermal feedback may not be provided through some regions of the casing 1610 according to an arrangement area of the heat-conductive layer 1641a. In this case, the some regions may become the noncontact part 1615, and a region through which thermal feedback is provided may become the contact part 1611.

3. Heat Dissipation Unit 3.1. Overview of Heat Dissipation Unit

As described above, a heat output module 1640 performs an exothermic operation and an endothermic operation to output thermal feedback through a contact surface 1641. Specifically, as shown in FIG. 5, when power is applied to a power terminal 1649 in a first direction in the heat output module 1640, heat may be generated in a substrate 1642, and heat may be absorbed in a substrate 1642a. In this case, when a contact surface 1641 is disposed outside the substrate 1642, hot feedback is provided through the contact surface 1641. In addition, when power is applied to the power terminal 1649 in a second direction, heat is absorbed in the substrate 1642, and heat is generated in the substrate 1642a. When the contact surface 1641 is disposed outside the substrate 1642, cold feedback is provided through the contact surface 1641. In this case, waste heat is transferred from the substrate 1642a in a feedback device 1600. Herein, the waste heat may refer to the remaining heat excluding heat which is used to provide a thermal experience to a user among heat generated in the feedback device 1600.

In addition, as shown in FIG. 6, a thermoelectric element array 1643 may include a plurality of thermoelectric couple groups 1644, and each of the thermoelectric couple groups 1644 may be connected to a power terminal 1649, thereby independently controlling each of the thermoelectric couple groups 1644. Thus, when currents in different directions are applied to a first thermoelectric couple group 1644-1 and a second thermoelectric couple group 1644-2, the first thermoelectric couple group 1644-1 performs an exothermic operation so that heat is generated in one region of the contact surface 1641. In addition, the second thermoelectric couple group 1644-2 performs an endothermic operation so that heat is absorbed in the other region of the contact surface 1641, thereby providing thermal grill feedback through the contact surface 1641. In this case, waste heat is transferred from a region of the substrate 1642a corresponding to the second thermoelectric couple group 1644-2 in the feedback device 1600.

When an amount of the waste heat is small, it does not matter. However, when an amount of the waste heat is greater than or equal to a certain level, components of the feedback device 1600 may be thermally degraded, and an unnecessary heat sensation is transferred to a user by the waste heat, resulting in a reduction in a thermal experience of the user.

Specifically, in the past, the heat output module 1640 could not be disposed at a curved portion of the feedback controller 1600. As a result, a region of the feedback controller 1600 in which the heat output module 1640 may be disposed was limited. That is, it has been difficult for the heat output module 1640 to directly provide thermal feedback to a user. As the thermal feedback has not been directly provided to the user, the waste heat also has not reduced a thermal experience of the user.

On the contrary, in the present invention, the substrate 1642 of the heat output module 1640 may be made of a flexible material to have flexibility so that the heat output module 1640 may be disposed at a curved portion of the feedback device 1600. As a result, the heat output module 1640 may directly provide thermal feedback to a user, and the waste heat may also have a considerable influence on a thermal experience of the user.

Figure 9:
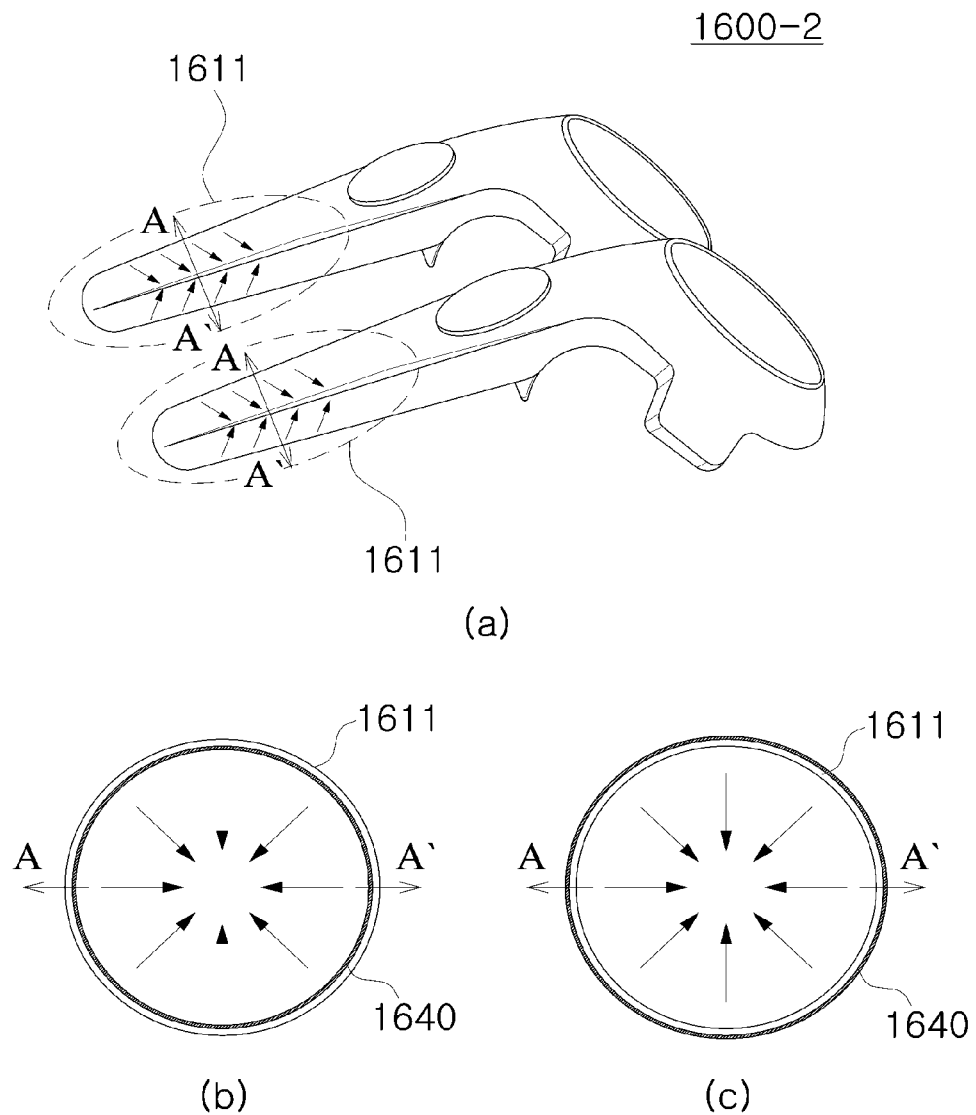
FIG. 9 is a view illustrating an arrangement of a heat output module in a feedback device according to an exemplary embodiment of the present invention.

In a specific example, referring to FIG. 9, (a) of FIG. 9 illustrates a feedback device 1600-2 in which a casing 1610 includes a stick member and a ring member. (b) is a cross-sectional view illustrating a contact part 1611 when a heat output module 1640 is disposed on an inner surface of the contact part 1611 in the feedback device 1600-2. (c) is a cross-sectional view illustrating the contact part 1611 when the heat output module 1640 is disposed on an outer surface of the contact part 1611 in the feedback device 1600-2.

In (a), (b), and (c) of FIG. 9, when cold feedback is provided to the contact part 1611, heat may be absorbed in a contact surface 1641 of a heat output module 1640 which is disposed to face the contact part 1611, and heat may be generated in a substrate 1624a disposed on a surface opposite to the contact surface 1641, i.e., the inner surface of the contact part 1611. In this case, residual heat generated in the substrate 1642a may become waste heat which reduces a thermal experience of a user and thermally degrades components of the feedback device 1600-2.

In another example, when hot feedback is provided to the contact part 1611, heat may be generated in the contact surface 1641 of the heat output module 1640, which is disposed to face the contact part 1611, and heat may be absorbed in the substrate 1624a disposed on the inner surface of the contact part 1611. The heat generated in the contact surface 1641 is used for a thermal experience of a user. However, even after an exothermic operation is stopped in the contact surface 1641, residual heat may be generated in the contact part 1611. Such residual heat may reduce a thermal experience of a user. Thus, the residual heat in the contact surface 1641 may also become waste heat. In addition, among heat generated in the feedback device, heat which reduces a thermal experience of a user may become waste heat.

The waste heat may be generated when the heat output module 1640 is disposed on the outer surface of the contact part 1611 as shown in (c) as well as when the heat output module 1640 is disposed on the inner surface of the contact part 1611 as shown in (b). In addition, in some cases, a level of the waste heat may be high enough that a user cannot bring a hand into contact with the contact part 1611. In this case, in order for a user to use the feedback device 1600-2 without inconvenience and to increase lifespan of the feedback device 1600-2, an element configured to appropriately dissipate waste heat is essential. Hereinafter, technology for dissipating waste heat to the outside, that is, heat dissipation technology will be described in detail.

Figure 10:
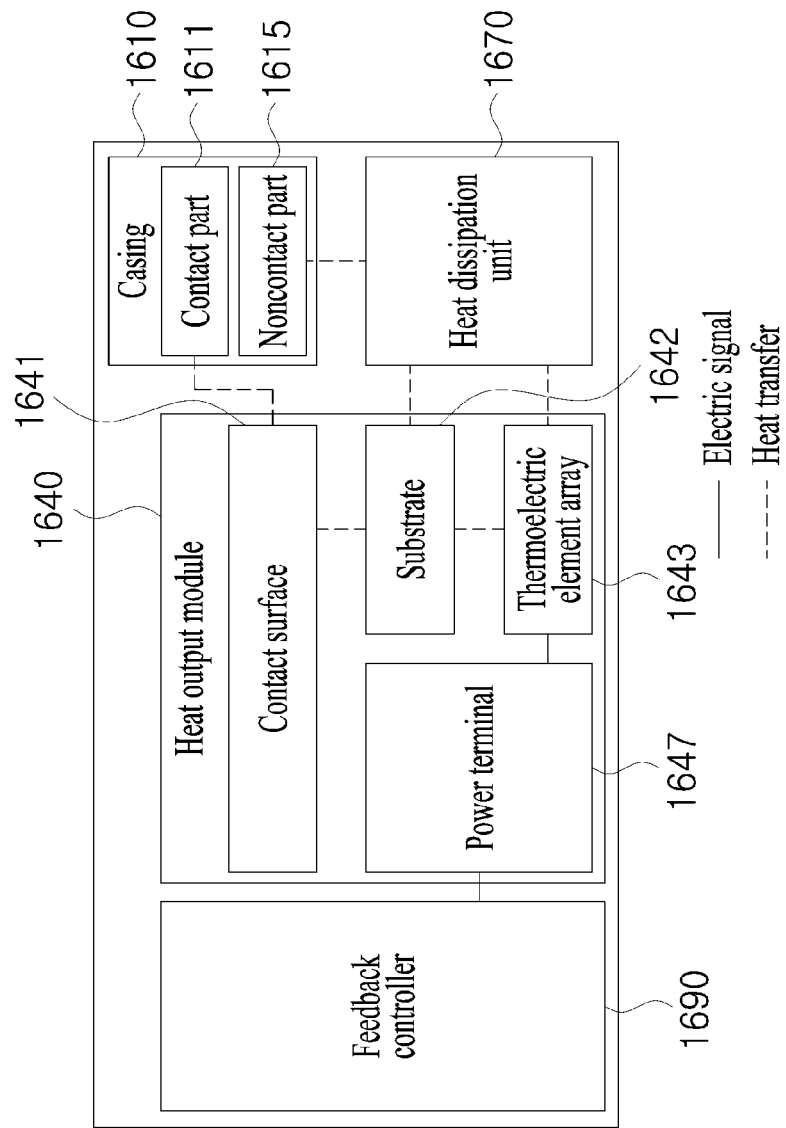
FIG. 10 is a block diagram illustrating a configuration of a feedback device when a heat dissipation part according to an exemplary embodiment of the present invention is provided.

FIG. 10 is a block diagram illustrating a configuration of a feedback device when a heat dissipation unit is provided according to an exemplary embodiment of the present invention.

Referring to FIG. 10, a feedback device 1600 includes a feedback controller 1690 and a heat output module 1640. Since content described with reference to FIG. 4 may be applied as it is to the feedback controller 1690 and the heat output module 1640, detailed descriptions thereof will be omitted.

In addition, the feedback device 1600 further includes a casing 1610. The casing 1610 may include a contact part 1611 and a noncontact part 1615. Herein, the contact part 1611 may be a region in which thermal feedback is output. Heat generated in a contact surface 1641 of the heat output module 1640 may be transferred to the contact part 1611, and a user may receive thermal experience due to the heat transferred to the contact part 1611. On the other hand, the noncontact part 1615 is a region in which thermal feedback is not output, and heat generated in the contact surface 1641 is not transferred to the noncontact part 1615.

In addition, the feedback device 1600 further includes a heat dissipation unit 1670. The heat dissipation unit 1670 may receive waste heat which is generated due to the output of the thermal feedback in the heat output module 1640, i.e., the contact surface 1641, a substrate 1642, and a thermoelectric element array 1643. Then, the heat dissipation unit 1670 may dissipate the waste heat to the outside of the feedback device 1600.

In an exemplary embodiment, the heat dissipation unit 1670 may dissipate the waste heat to the outside through the noncontact part 1615 but may not dissipate the waste heat to the outside through the contact part 1611. Specifically, as described above, the contact part 1611 is a region with which a user comes into contact when content is reproduced and in which thermal feedback is provided. When waste heat is dissipated through the contact part 1611, a thermal experience of a user may be reduced by the waste heat. On the contrary, the noncontact part 1615 is a region in which a user's body does not come into contact with the feedback device 1600 due to a usage pattern when content is reproduced and which is irrelevant to the provision of thermal feedback. When waste heat is dissipated through the noncontact part 1615, the dissipated waste heat may not affect a thermal experience of a user. Therefore, the heat dissipation unit 1670 may dissipate waste heat through the noncontact part 1615.

In order for the waste heat to be dissipated through the noncontact part 1615, the waste heat should be transferred to the noncontact part 1615 and the transferred waste heat should be dissipated from the noncontact part 1615.

To this end, the heat dissipation unit 1670 includes a heat transfer part configured to transfer waste heat from the heat output module 1640 to the noncontact part 1615 and a heat dissipation part configured to dissipate waste heat from the noncontact part 1615. According to exemplary embodiments, the heat dissipation unit 1670 may include both the heat transfer part and the heat dissipation part or may include only one of the heat transfer part and the heat dissipation part.

In addition, as described above, in an exemplary embodiment, the waste heat may be generated when cold feedback or thermal grill feedback is output from the heat output module. Accordingly, the heat dissipation unit 1670 may transfer or dissipate the waste heat from when the cold feedback or the thermal grill feedback is output from the heat output module.

For convenience of description, a region through which waste heat is dissipated in a feedback device having various shapes, i.e., a position of a noncontact part 1615 will be firstly described, and then, a heat transfer part and a heat dissipation part will be sequentially described.

3.2. Waste Heat Dissipation Region

FIGS. 11 to 20 are views illustrating a feedback device including a casing with various shapes according to an exemplary embodiment of the present invention.

Figure 11:
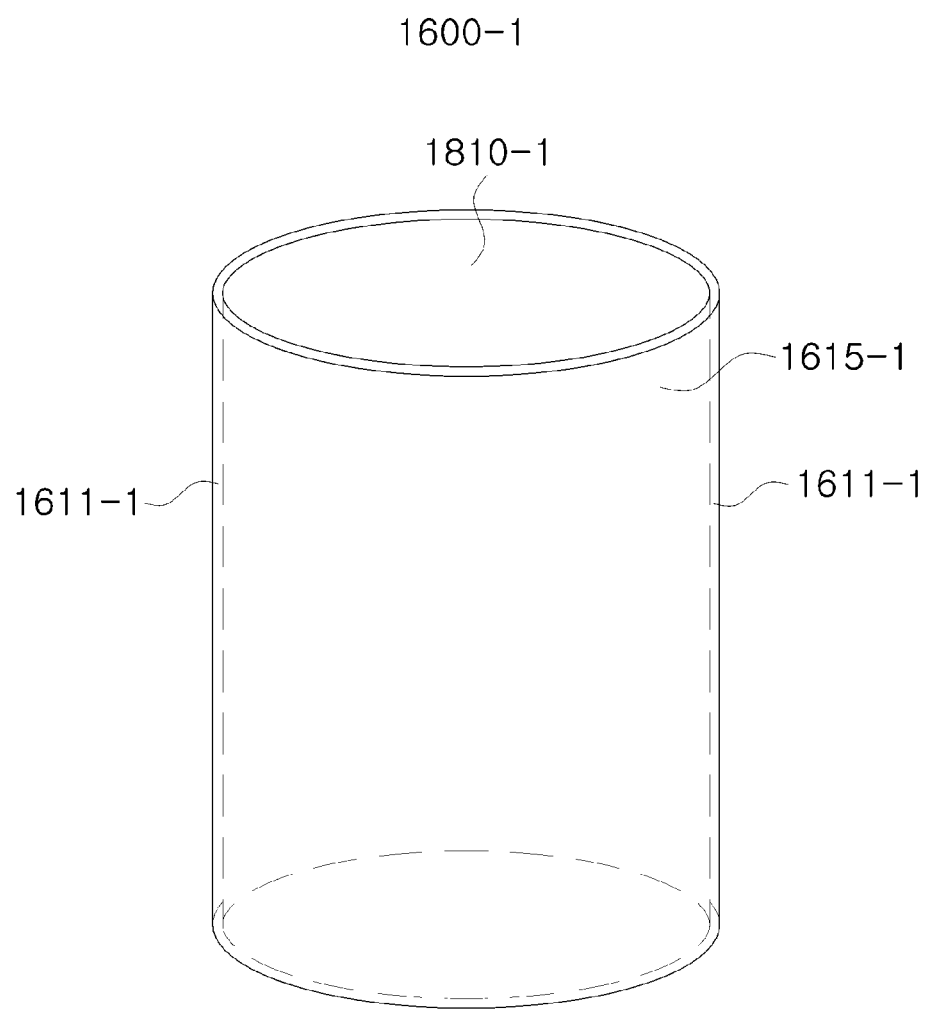

Referring to FIG. 11, a casing 1610-1 of a feedback device 1600-1 may include a cylindrical member. In addition, the casing 1610-1 may have a cavity 1810-1 extending to pass through the cylindrical member, and the cavity 1810-1 may be formed in an inner surface of the cylindrical member.

In an exemplary embodiment, when content is reproduced, a user's body may come into contact with an outer surface of the casing 1600-1, i.e., a circumferential surface of the cylindrical member due to a usage pattern of a user. The user's body may not come into contact with the inner surface of the case 1610-1, i.e., the cavity 1810-1. Accordingly, in the feedback device 1600-1, the outer surface of the casing 1600-1 may become a contact part 1611-1, and the inner surface of the casing 1600-1, i.e., the cavity 1810-1, may become a noncontact part 1615-1.

In an exemplary embodiment, a heat output module 1640 may be disposed in at least a partial region of the contact part 1611-1. Waste heat generated in the heat output module disposed in the contact part 1611-1 may be dissipated through the at least a partial region of the noncontact part 1615-1.

Figure 12:
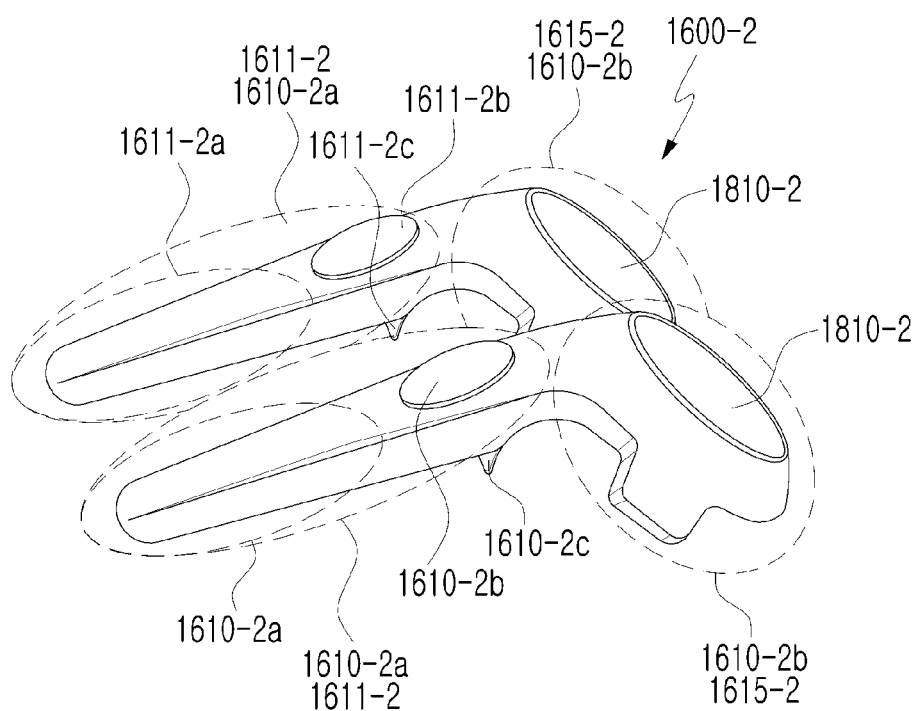

Referring to FIG. 12, a casing 1610-2 of a feedback device 1600-2 may include a stick member 1610-2a and a ring member 1610-2b. In an exemplary embodiment, the ring member 1610-2b may have a cavity 1810-2 which passes through the interior of the ring member 1610-2b.

When content is reproduced, the stick member 1610-2a may be gripped by a user's hand, and the ring member 1610-2b may not be gripped by the user's hand. In this case, the stick member 1610-2a may become a contact part 1611-2, and the ring member 1610-2b may become a noncontact part 1615-2.

When content is reproduced, the feedback device 1600-2 may output thermal feedback to the contact part 1611-2. A heat output module 1640 may be disposed in the contact part 1611-2 so as to output thermal feedback. For example, the heat output module 1640 may be disposed in a first contact part 1611-2a formed at a lower stick of the stick member 1610-2a, may be disposed in a second contact part 1611-2b formed at a button of the stick member 1610-2a, or may be formed in a third contact part 1611-2c formed at a trigger button of the stick member 1610-2a. And, waste heat generated in the heat output module 1640 may be dissipated through at least a partial region of the noncontact part 1615-2 that is the ring member 1610-2b. For example, the waste heat may be dissipated from the ring member 1610-2b to the cavity 1810-2, and may be dissipated outside the ring member 1610-2b.

Figure 13:
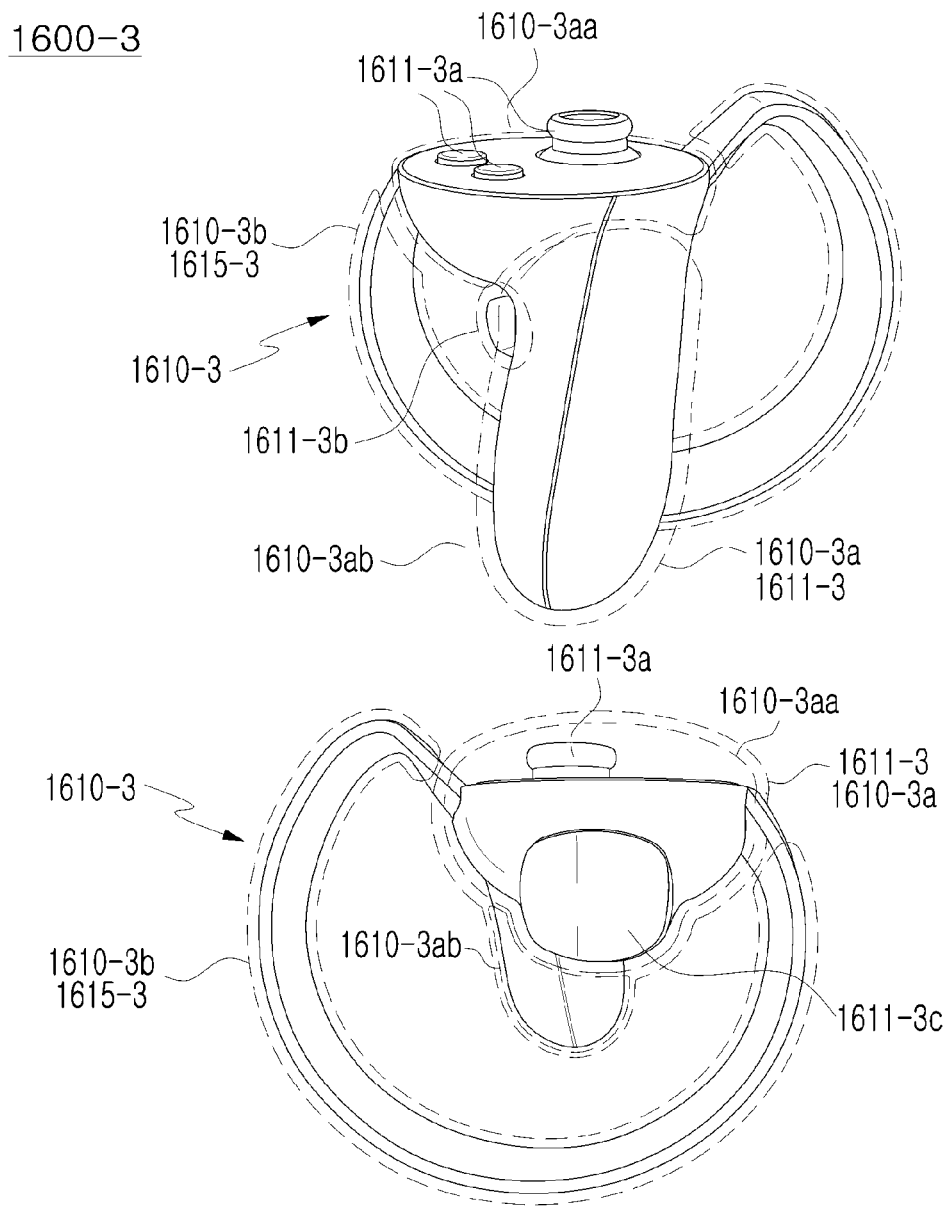

Referring to FIG. 13, a casing 1610-3 of a feedback device 1600-3 may include a stick member 1610-3a and a ring member 1610-3b.

In an example of FIG. 13, the stick member 1610-3a may include a stick part 1610-3ab having a stick shape and a hemispherical part 1610-3aa having a hemispherical shape. In an exemplary embodiment, a certain button may be provided in the stick part 1610-3ab and/or the hemispherical part 1610-3aa. In FIG. 13, since the ring member 1610-3b is not closed, the ring member 1610-3b may be expressed as a half ring member.

When content is reproduced, due to a usage pattern, a user's hand may come into contact with the stick member 1610-3a and may not come into contact with the ring member 1610-3b. In this case, the stick member 1610-3a may become a contact part 1611-3, and the ring member 1610-3b may become a noncontact part 1615-3.

In an exemplary embodiment, a heat output module 1640 may be disposed in the contact part 1611-3 so as to provide thermal feedback. For example, the heat output module 1640 may be disposed in the stick part 1610-3ab and/or the hemispherical part 1610-3aa. Specifically, in order to provide thermal feedback to a user's palm, the heat output module 1640 may be disposed in at least a portion of a circumference of the stick part 1610-3ab. In addition, in order to output thermal feedback to a user's finger, the heat output module 1640 may be disposed in at least a portion of a circumference of the hemispherical part 1610-3aa. Furthermore, in order to provide thermal feedback to a user's finger, the heat output module 1640 may be disposed in at least a portion of buttons 1611-3a, 1611-3b, and 1611-3c of the stick part 1610-3ab and the hemispherical part 1610-3aa.

Waste heat generated in the heat output module 1640 may be dissipated through at least a partial region of an inner side and/or an outer side of the noncontact part 1615-3 that is the ring member 1610-3b.

Figure 14:
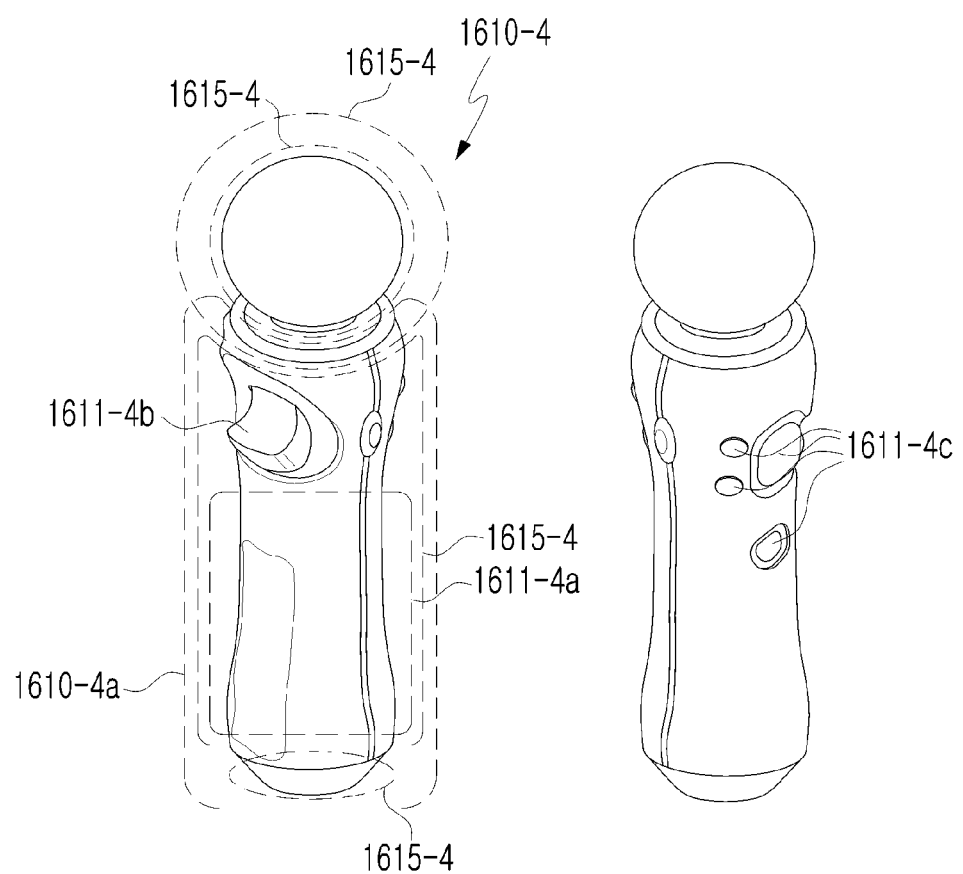

Referring to FIG. 14, a casing 1610-4 of a feedback device 1600-4 may include a stick member 1610-4a and an additional member 1610-4b.

Herein, the additional member 1610-4b may be connected to at least one region of the stick member 1610-4a. An example of the additional member 1610-4b may include an accessory, a display, various sensors, a battery, or the like.

When content is reproduced, due to a usage pattern, a central region of the stick member 1610-4a may be gripped by a user's hand. The user's hand may not come into contact with both ends of the stick member 1610-4a and the additional member 1610-4b.

In this case, the central region of the stick member 1610-4a may become a contact part 1611-4, and the both ends of the stick member 1610-4a and the additional member 1610-4b may become a noncontact part 1615-4.

A heat output module 1640 may be disposed in the contact part 1611-4 so as to provide thermal feedback. For example, the heat output module 1640 may be disposed in at least a portion of a handle region 1611-4a of the stick member 1610-4a and buttons 1611-4b and 1611-4c. In addition, waste heat generated in the heat output module 1640 may be dissipated through at least a partial region of the noncontact part 1615-4. For example, the waste heat may be dissipated from the additional member 1610-4b or may be dissipated from both ends of the stick member 1610-4a.

Figure 15:
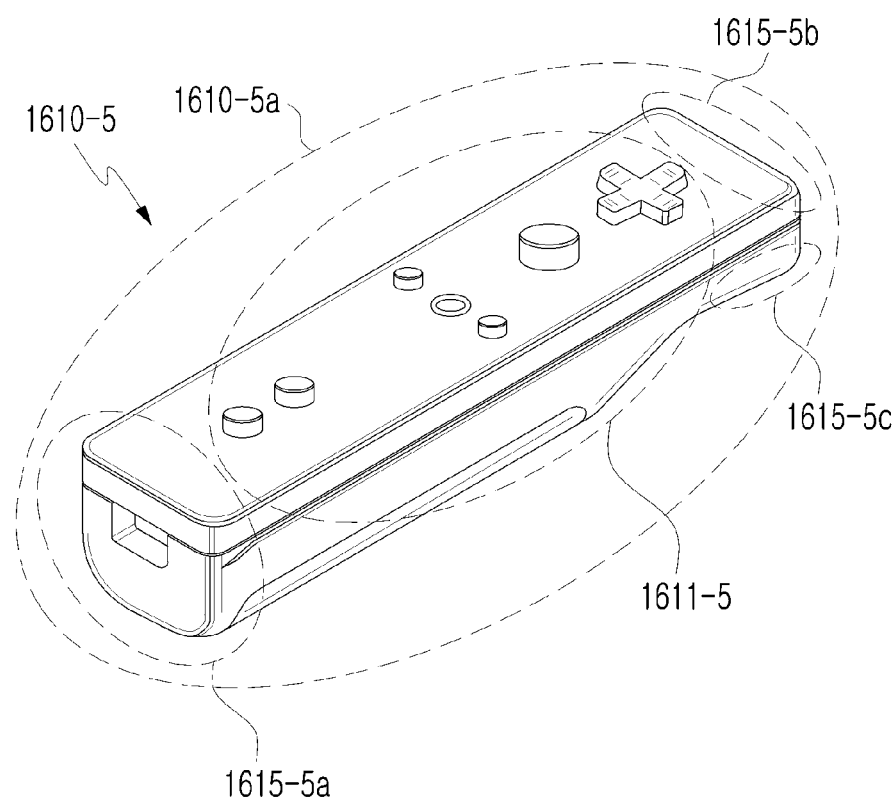

Referring to FIG. 15, a casing 1610-5 of a feedback device 1600-5 may include a stick member 1610-5a.

In FIG. 15, the stick member 1610-5a is illustrated as an approximate quadrangular type stick, but the stick member 1610-5a may have various stick types such as a circular type, a triangular type, a polygonal type or the like. In addition, the stick member 1610-5a may include at least one button.

In an example of FIG. 15, the button may be disposed in the central region of an upper surface of the stick member 1610-5a. When content is reproduced, due to a usage pattern, a user's hand may come into contact with the stick member 1610-5a with respect to the button. Accordingly, a contact part 1611-5 may be set with respect to a region of the stick member 1610-5a in which the button is disposed. In addition, both ends of the stick member 1610-5a and/or a rear surface of the stick member 1610-5a may be set as noncontact parts 1615-5a, 1615-5b, and 1615-5c. As described above, a heat output module 1640 may be disposed in the contact part 1611-5. A heat dissipation unit 1670 may be disposed in the noncontact parts 1615-5a, 1615-5b, and 1615-5c to dissipate waste heat generated in the heat output module 1640 to the outside.

Figure 16:
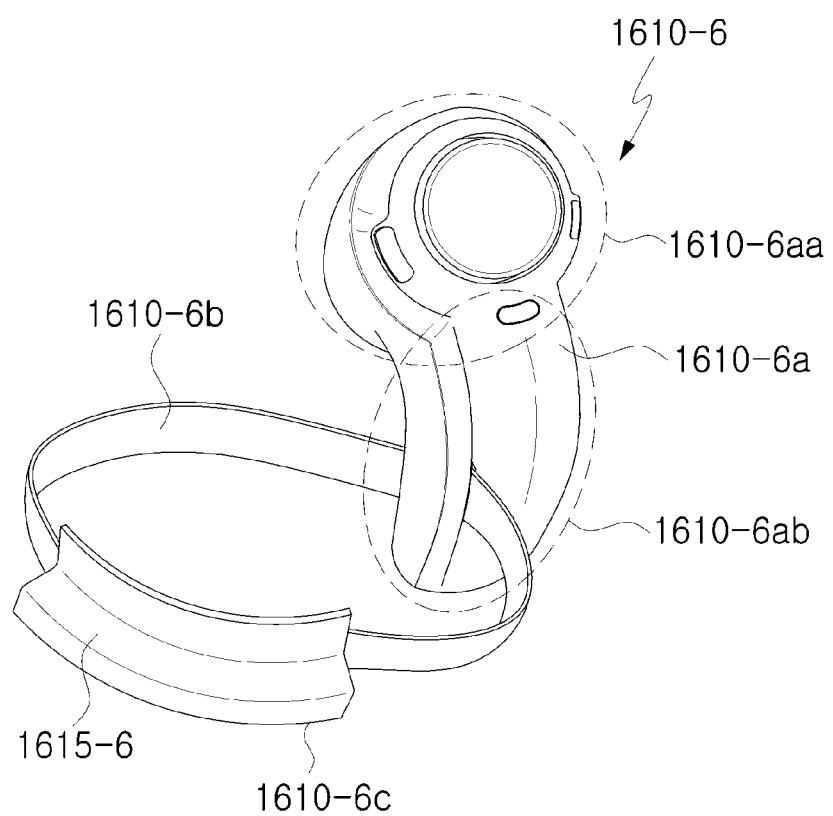

Referring to FIG. 16, a casing 1610-6 of a feedback device 1600-6 may include a stick member 1610-6a and a connection member 1610-6b and 1610-6c.

In an example of FIG. 16, the stick member 1610-6a may include a stick part 1610-6ab having a stick shape and a hemispherical part 1610-6aa having a hemispherical shape. In an exemplary embodiment, a certain button may be provided in the stick part 1610-6ab and/or the hemispherical part 1610-6aa.

The connection member 1610-6b and 1610-6c may bring a user's body into close contact with the stick member 1610-6a. The connection member 1610-6b and 1610-6c may include a first connection member 1610-6b and a second connection member 1610-6c. For example, the first connection member 1610-6b may be made of a stretchable material or may be configured such that a length of the first connection member 1610-6b is adjusted. In addition, the second connection member 1610-6c may include a sensing module 1630 such as a motion sensor, an acceleration sensor, a gyro sensor, or the like.

When content is reproduced, due to a usage pattern, a user's hand may contact into contact with the stick part 1610-6ab and the hemispherical part 1610-6aa. In addition, a user's hand may come into contact with inner surfaces of the first connection member 1610-6b and the second connection member 1610-c, i.e., surfaces of the first connection member 1610-6b and the second connection member 1610-c, which face the stick member 1610-6a. Therefore, the stick part 1610-6ab, the hemispherical part 1610-6aa, and the inner surfaces of the first connection member 1610-6b and the second connection member 1610-c may become a contact part 1611. However, the user's hand may not come into contact with outer surfaces of the first connection member 1610-6b and the second connection member 1610-c, i.e., surfaces of the first connection member 1610-6b and the second connection member 1610-c which do not face the stick member 1610-6a. Therefore, the outer surfaces of the first connection member 1615-6b and the second connection member 1610-6c may become a noncontact part 1615-6.

In an exemplary embodiment, a heat output module 1640 may be disposed in the contact part 1611. Waste heat generated in the heat output module 1640 may be dissipated through the noncontact part 1615-6. Specifically, a heat transfer part to be described later may be disposed in the first connection member 1600-6b, and a heat dissipation part to be described later may be disposed on the outer surface of the second connection member 1600-6c. In this case, waste heat generated in the heat output module 1640 of the contact part 1611 may pass through the first connection member 1600-6b and may be dissipated from the outer surface of the second connection member 1600-6c.

Figure 17:
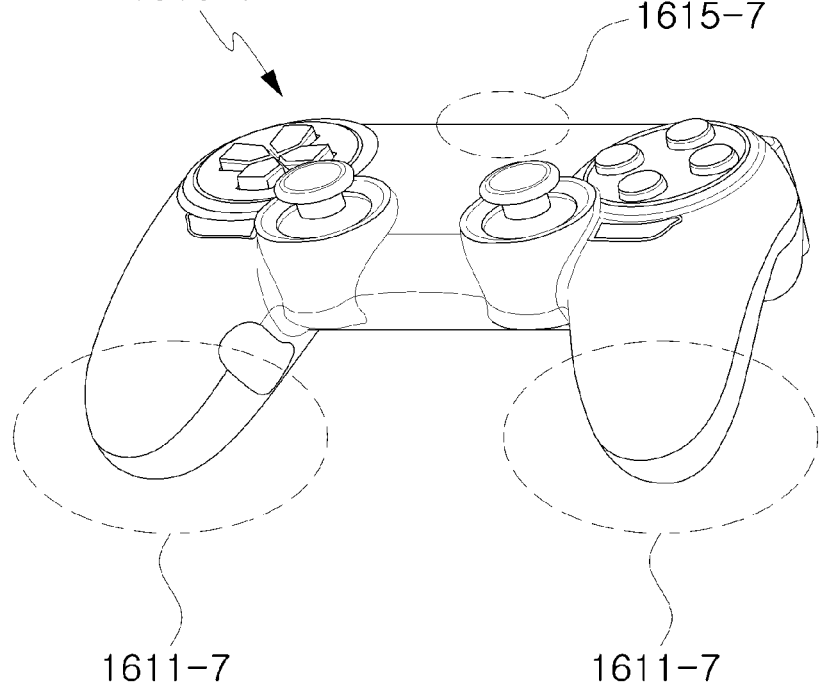

Referring to FIG. 17, a casing 1610-7 of a feedback device 1600-7 may include a pad member. In the feedback device 1600-7, a contact part 1611-7 may be a surrounding region of a button of the pad member, and a noncontact part 1615-7 may be a central region or a rear region of the pad member.

Figure 18:
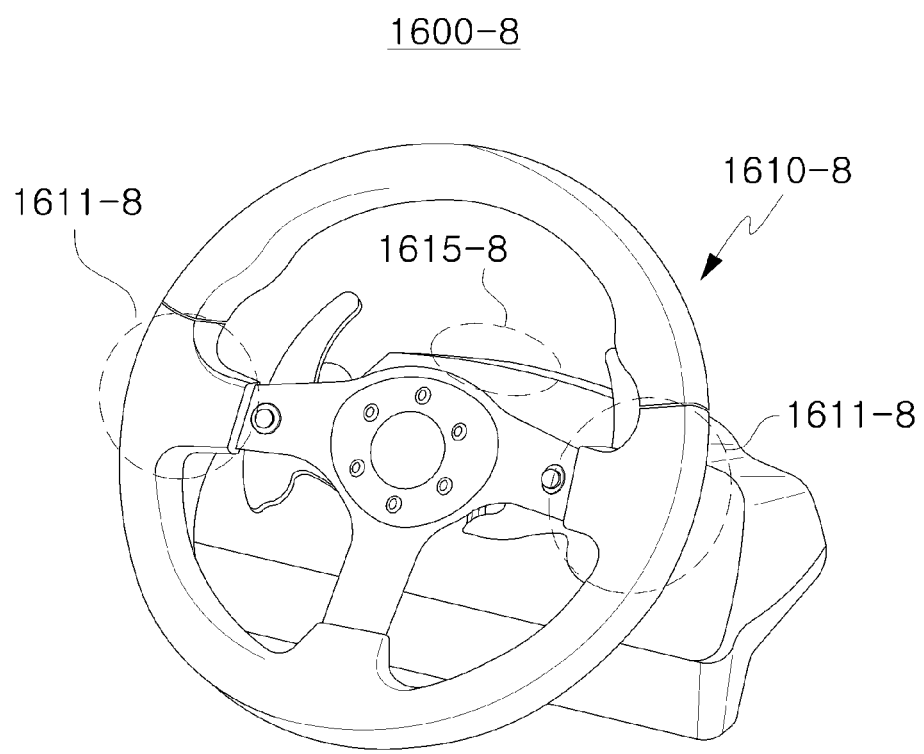

Referring to FIG. 18, a casing 1610-8 of a feedback device 1600-8 may include a wheel member and a fixing member for fixing the wheel member. In the feedback device 1600-8, a contact part 1611-8 may be at least a partial region of the outer surface of the wheel member, and a noncontact part 1615-8 may be at least a partial region of the fixing member.

Figure 19:
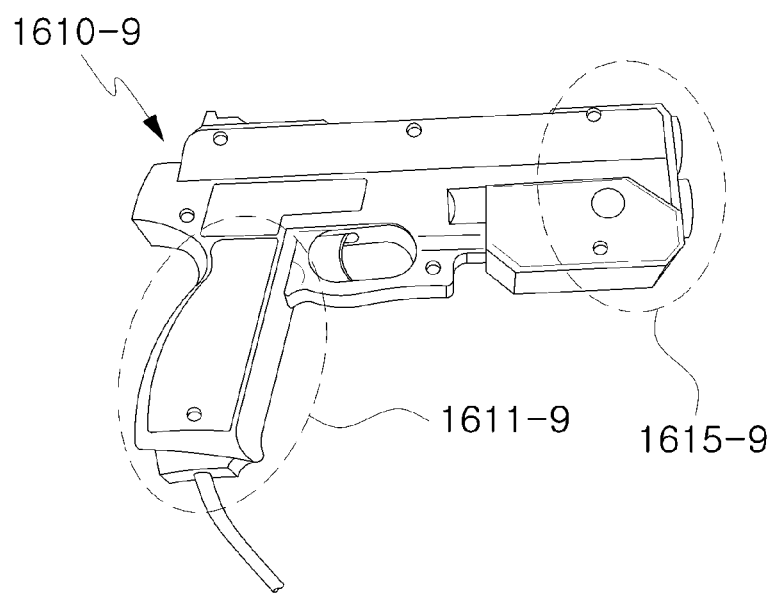

Referring to FIG. 19, a casing 1610-9 of a feedback device 1600-9 may include a gun member. In the feedback device 1600-9, a contact part 1611-9 may be a trigger and/or grip region of the gun member, and a noncontact part 1615-9 may be a barrel region and/or a surrounding region of a gun muzzle.

In descriptions provided with reference to FIGS. 17 to 19, a heat output module 1640 may be disposed in the contact parts 1611-7, 1611-8, and 1611-9. Waste heat generated in the heat output module 1640 may be dissipated through the noncontact parts 1615-7, 1615-8, and 1615-9.

In (a) and (b) of FIG. 20, a casing 1610-10 of a feedback device 1600-10 may include a stick member 1610-10a. In this case, the casing 1610-10 may further include other members in addition to the stick member 1610-10a. For example, in (a), the casing 1610-10 may further include a ring member, and in (b), the casing 1610-10 may further include a half ring member. Of course, the casing 1610-10 may include only the stick member 1610-10a.

In an exemplary embodiment, the stick member 1610-10a may have a recess 1610-10b in which at least a portion of the stick member 1610-10a is recessed. For example, in (a) and (b) of FIG. 20, the recess 1610-10b may be formed in a lower end of the stick member 1610-10a.

When content is reproduced, a user's hand may come into contact with an outer surface of the stick member 1610-10a, and the user's hand may not reach the recess 1610-10b of the stick member 1610-10a. Therefore, even when waste heat is dissipated from the recess 1610-10b, the waste heat may not affect the user. Thus, the outer surface of the stick member 1610-10a may become a contact part, and the recess 1610-10b may become a noncontact part.

A heat output module 1640 may be disposed in the contact part. Waste heat generated in the heat output module 1640 may be dissipated through the noncontact part. In one example, a heat dissipation part to be described later may be disposed in the recess 1610-10b, and the waste heat may be dissipated from the recess 1610-10b through the heat dissipation part.

In an exemplary embodiment, due to the recess 1610-10b, the feedback device 1600-10 may be easily mounted on an external device. For example, when the external device is a charger, the charger may come into contact with the recess 1610-10b, and the charger may be fixed to the feedback device 1600-10 due to the contact.

Accordingly, a charging port configured to charge a driving power of the feedback device 1600-10 may be disposed in the recess 1610-10b. In this case, the charger and the charging port of the feedback device 1600-10 may be easily docked.

In an exemplary embodiment of the present invention, a casing 1610, i.e., a contact part 1611 and/or a noncontact part 1615 may be coupled through a plurality of members. Specifically, various components such as a communication module 1620 and various sensing modules 1630 may be included in the contact part 1611 and the noncontact part 1615. In addition, a heat output module 1640 and/or a heat transfer part to be described later may be disposed in the contact part 1611, and the heat transfer part and/or a heat dissipation part to be described later may be disposed in the noncontact part 1615.

When the contact part 1611 and/or the noncontact part 1615 are coupled through one member, the heat transfer part and/or the heat dissipation part may be difficult to dispose in the contact part 1611 and/or the noncontact part 1615.

However, in the present invention, since the contact part 1611 and/or the noncontact part 1615 are coupled through the plurality of members, the heat transfer part and/or the heat dissipation part may be easily disposed in the contact part 1611 and/or the noncontact part 1615.

For example, as in an example of FIG. 12, when the noncontact part 1615 is a ring member 1610-2b, the ring member 1610-2b may be coupled through an upper member and a lower member, may be coupled through a left member and a right member, or may be coupled through an inner member and an outer member. In addition, the contact part 1611 and the noncontact part 1615 may be coupled through members disposed at various positions and having various shapes.

Furthermore, in an exemplary embodiment, when the noncontact part 1615 is coupled through a plurality of members and the heat transfer part and/or the heat dissipation part are disposed in a first member of the plurality of members, waste heat may be dissipated from the first member.

In addition, in the present invention, only when all of the plurality of members are coupled is thermal feedback output in the feedback device 1610, and when the plurality of members are not coupled, the feedback device 1610 is not normally operated. Thus, thermal feedback may not be output. That is, when the plurality of members are not coupled, the waste heat is not generated, and only when the plurality of members are coupled may the waste heat be dissipated through the noncontact part 1615.

3.3. Heat Transfer Part

As described above, since a heat output module is disposed in a contact part 1611 of a casing 1610, waste heat is generated in the contact part 1611, and waste heat may be dissipated through a certain region (i.e., a waste heat dissipation region) of a noncontact part 1615. When the contact part 1611 and the waste heat dissipation region of the noncontact part 1615 are in physical contact with each other, the waste heat may be directly transferred from the contact part 1611 to the waste heat dissipation region. However, when the contact part 1611 and the waste heat dissipation region of the noncontact part 1615 are physically spaced apart from each other, the waste heat dissipation region may not directly receive waste heat from the contact part 1611 and may receive the waste heat through the heat transfer part. Hereinafter, various configurations of the heat transfer part will be described.

3.3.1. Heat Transfer Part Disposed on Wall of Casing

Figure 21:
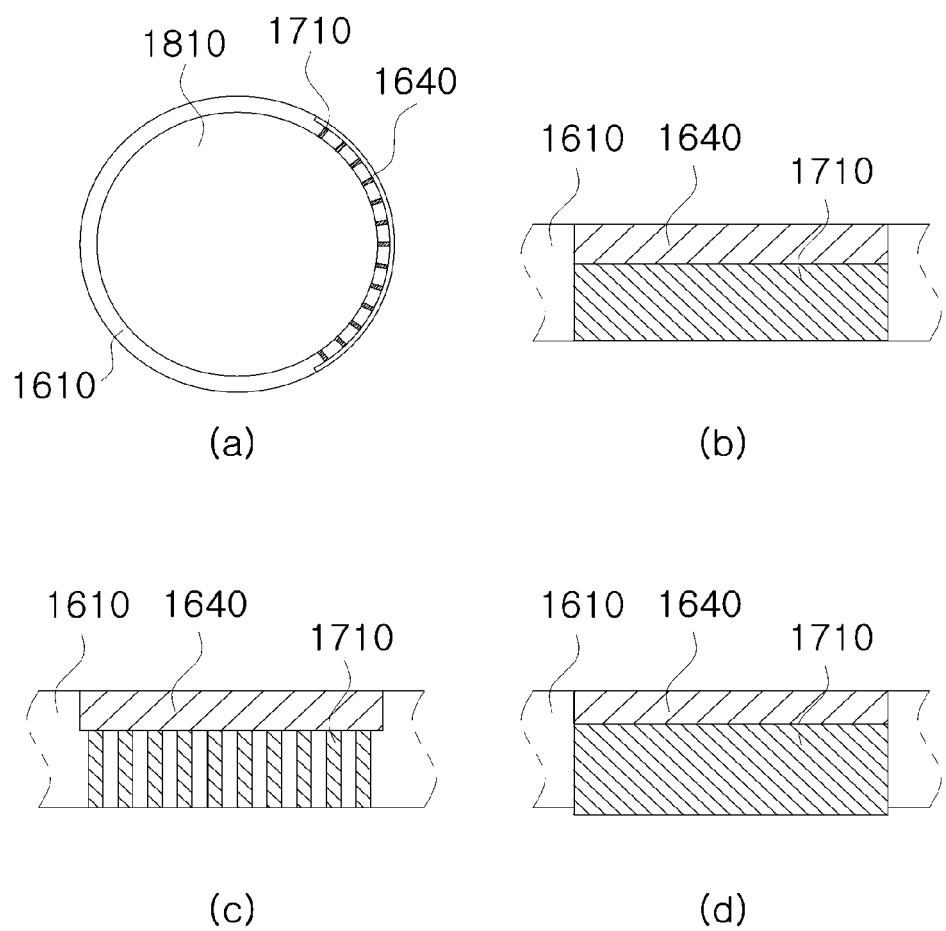
FIG. 21 is a view illustrating a heat transfer part disposed on a wall of a casing according to an exemplary embodiment of the present invention.

FIG. 21 is a view illustrating a heat transfer part disposed on a wall of a casing according to an exemplary embodiment of the present invention. For convenience of description, a member disposed on the wall of the casing to transfer heat will be referred to as a heat transfer structure. Referring to FIG. 21, (a) is a cross-sectional view illustrating a casing 1610 in which a heat output module 1640 and a heat transfer structure 1710 are disposed. (b) to (d) are views illustrating various examples of the heat transfer structure 1710.

For convenience of description, an arrangement of the heat output module 1640 and the heat transfer structure 1710 when the casing 1610 is a cylindrical member will be described with reference to FIG. 21. However, the present invention is not limited thereto, and content described with reference to FIG. 21 may be applied as it is even when the casing 1610 includes other members such as a stick member. In addition, the heat output module 1640 and the heat transfer structure 1710 are illustrated in FIG. 21 as being formed in a portion of the casing 1610, but the present invention is not limited thereto. The heat output module 1640 and the heat transfer structure 1710 may be formed on the entirety of the casing 1610.

In (a), a hole or a groove may be formed in a wall of the casing 1610, and the heat output module 1640 may be disposed in the hole or the groove. Waste heat may be generated in the heat output module 1640. The waste heat may be transferred to a cavity 1810 which is a noncontact part 1615 with which a user's body does not come into contact, and thus may be dissipated from the cavity 1810. However, when a thickness of the heat output module 1640 is not greater than a thickness of the wall of the casing 1610, the waste heat generated in the heat output module 1640 may not be transferred to the cavity 1810, and may be transferred to an outer surface of the casing 1610 rather than the cavity 1810. In this case, the waste heat may be transferred to a user and may reduce a thermal experience of the user.

In order to solve the above problems, the heat transfer structure 1710 is additionally provided in the present invention.

In an exemplary embodiment, the heat transfer structure 1710 is embedded in the wall of the casing 1610 and has one end in surface contact with the heat output module 1640 and the other end exposed toward the cavity 1810. Thus, the heat transfer structure 1710 functions to allow heat to be smoothly transferred between the heat output module 1640 and the cavity 1810. That is, the heat transfer structure 1710 functions as a heat transfer part.

Although the casing 1610 may be made of a material having low heat conductivity or may be thick, due to the heat transfer structure 1710, waste heat generated in an inner surface of the heat output module 1640 may be smoothly transferred to the cavity 1810 through the heat transfer structure 1710 and dissipated. Accordingly, heat may be more effectively absorbed in an outer surface of the heat output module 1640. Thus, since the heat transfer structure 1710 is provided to transfer heat between the heat output module 1640 and the cavity 1810, it is preferable that the heat transfer structure 1710 be made of a material having high thermal conductivity, for example, a metal.

In an exemplary embodiment, the heat transfer structure 1710 may be formed in the form of a fin which is widely commercialized and productized as a component used for a smooth heat transfer. In addition, the heat transfer structure 1710 may have various implementations.

For example, referring to (b) to (d), the heat transfer structure 1710 may be implemented in a fin shape as shown in (b).

In addition, the heat transfer structure 1710 may be implemented as an integrated lump shape positioned within the wall of the casing 1610 as shown in (c).

In addition, the heat transfer structure 1710 may be formed to protrude from the wall of the casing 1610 as shown in (d). In this case, the waste heat generated in the heat output module 1640 may be directly transferred to the cavity 1810 by the heat transfer structure 1710 without passing through the casing 1610. In addition, when a separate heat dissipation unit (for example, a heat dissipation fan) is disposed on a lower surface of the casing 1610 rather than the cavity 1810, the waste heat generated in the heat output module 1640 may pass through the heat transfer structure 1710 and may be directly transferred to the heat dissipation unit.

3.3.2. Heat Transfer Part Disposed in Casing

Figure 22:
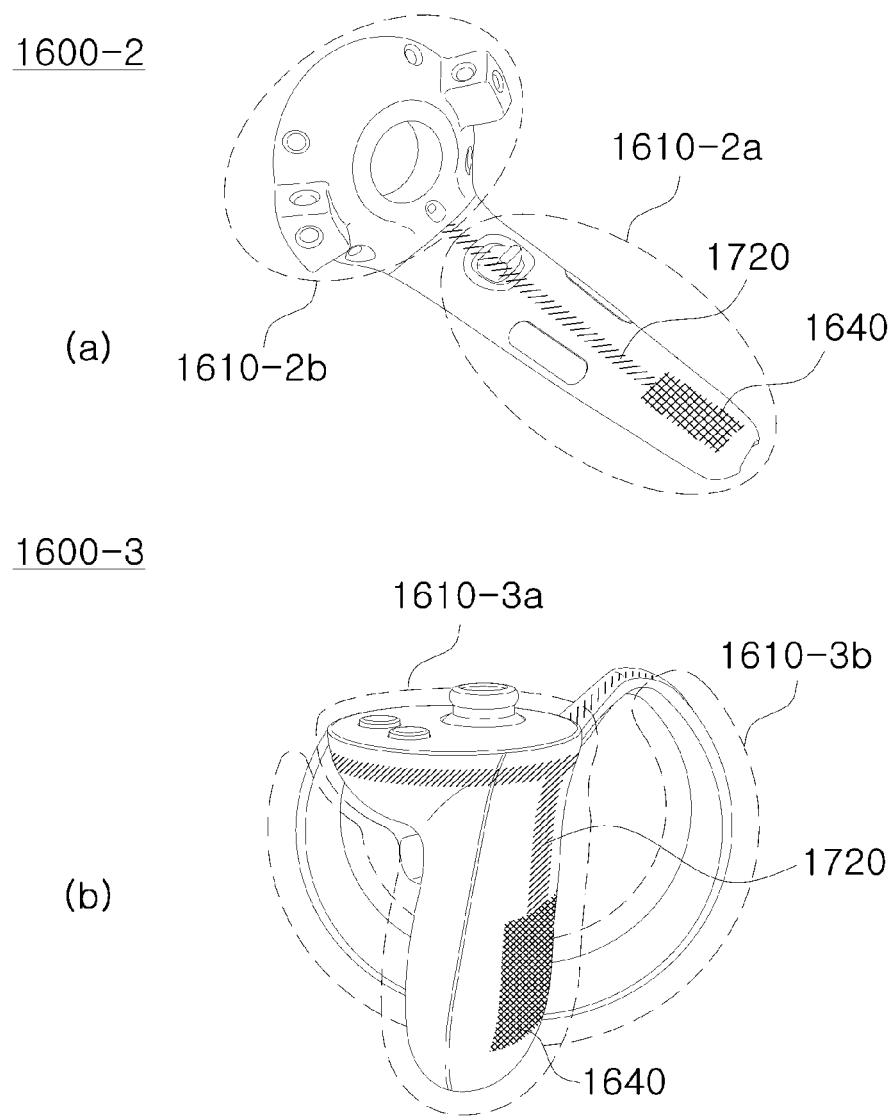
FIG. 22 is a view illustrating a heat transfer part disposed in a casing according to an exemplary embodiment of the present invention.

FIG. 22 is a view illustrating a heat transfer part disposed in a casing according to an exemplary embodiment of the present invention. For convenience of description, hereinafter, a member which is disposed outside or inside a casing rather than a wall of the casing to transfer heat will be referred to as a heat transfer member.

Referring to FIG. 22, (a) is an example in which a heat transfer member is disposed in a feedback device 1600-2. (b) is an example in which a heat transfer member is disposed in a feedback device 1600-3.

Figure 23:
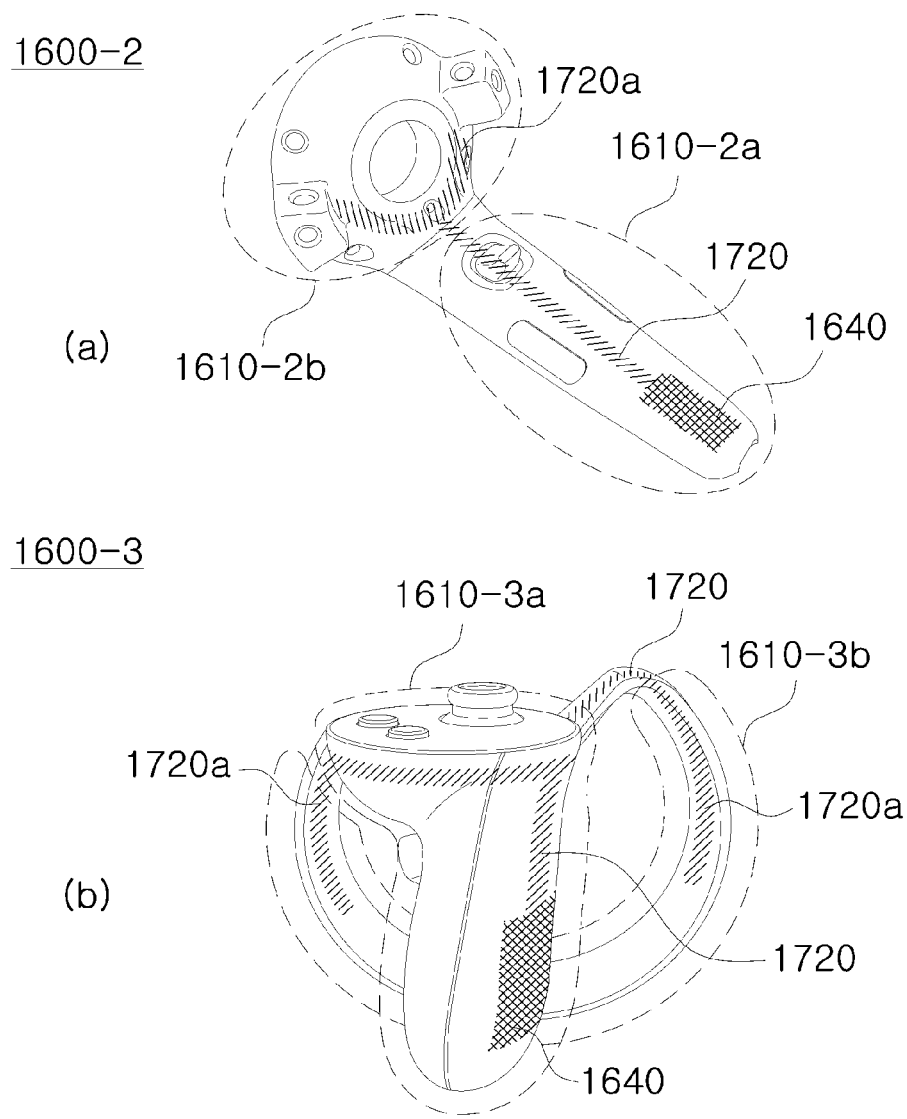
FIG. 23 is a view illustrating a heat transfer part disposed in a casing according to another exemplary embodiment of the present invention.

For convenience of description, an arrangement of a heat output module 1640 and a heat transfer member 1720 in the feedback devices 1600-2 and 1600-3 including a stick member and a ring member will be described with reference to FIGS. 22 and 23. However, the present invention is not limited thereto, and content described with reference to FIGS. 22 and 23 may be applied as it is even when a casing 1610 includes other members such as a cylindrical member. In addition, a heat output module 1640 is illustrated in FIGS. 22 and 23 as being formed in a portion of a casing 1610-2a or 1610-3a, but the present invention is not limited thereto. The heat output module 1640 may be formed on the entirety of the casing 1610-2a or the casing 1610-3a.

In (a) and (b), stick members 1610-2a and 1610-3a may become contact parts 1611, and ring members 1610-2b and 1610-3b may become noncontact parts 1615. Therefore, the heat output module 1640 may be disposed on an inner or outer surface of at least a portion of the stick member 1610-2a or 1610-3a in order to output thermal feedback from the contact part 1611. However, waste heat should be dissipated from the noncontact part 1615, but since the heat output module 1640 generating the waste heat is disposed in the contact part 1611, the waste heat may not be dissipated from the noncontact part 1615, but rather the waste heat may be dissipated from the contact part 1611. Therefore, the waste heat should be transferred from the contact part 1611 to the noncontact part 1615. To this end, the heat transfer member 1720 may be disposed in at least a partial region of the contact part 1611.

The heat transfer member 1720 may refer to a member which transfers heat transferred from a first region of the heat transfer member 1720 to a second region of the heat transfer member 1720. An example of the heat transfer member 1720 is a heat pipe. The heat pipe is a pipe from which a gas is discharged and may contain a volatile material therein. When heat is present in a first stage of the heat pipe, the volatile material may transfer heat energy to a second stage of the heat pipe. Copper, stainless steel, ceramic, tungsten, or the like may be used as a material of a main body of the heat pipe, and a porous fiber or the like may be used as a material of an inner wall of the heat pipe. Also, methanol, acetone, water, mercury, or the like may be used as the volatile material in the heat pipe.

In an exemplary embodiment, the heat transfer member 1720 may be disposed between the heat output module 1640 of the contact part 1611 and the noncontact part 1615 and may set a heat transfer path between the heat output module 1640 and the noncontact part 1615. Accordingly, the waste heat generated in the heat output module 1640 may be transferred to the noncontact part 1615 along the heat transfer path. As the waste heat is moved to the noncontact part 1615, the waste heat may not be dissipated from the contact part 1611.

In addition, the heat transfer member 1720 may be disposed inside or outside the stick member 1610-2a or 1610-3a according to a design.

In addition, the heat transfer member 1720 may not be connected to other components such as a feedback device, and specifically, a battery, a sensor, a substrate, and a processor inside the stick member 1610-2a or 1610-3a, except for the heat output module 1640. Accordingly, the other components may be insulated from the waste heat and not thermally degraded by the waste heat.

FIG. 23 is a view illustrating a heat transfer part disposed in a casing according to another embodiment of the present invention.

Referring to FIG. 23, (a) and (b) illustrates examples in which a heat transfer member 1720 is disposed on stick members 1610-2a and 1610-3a which are a contact part 1611, and a heat transfer member 1720a is additionally disposed on ring members 1610-2b and 1610-3b which are a noncontact part 1615.

As described above with reference to FIG. 22, a heat transfer path from the contact part 1611 to the noncontact part 1615 may be formed by the heat transfer member 1720, and waste heat may be dissipated from the noncontact part 1615 through the heat transfer path. Since the heat transfer member 1720 transfers the waste heat only to one region of the noncontact part 1615, the waste heat is dissipated only from one region. Thus, a dissipation effect of the waste heat may be reduced. In order to solve such a problem, the heat transfer member 1720a may be additionally disposed in the noncontact part 1611 other than the contact part 1615. The heat transfer member 1720a may be thermally connected to the heat transfer member 1720. The heat transfer member 1720a may receive waste heat from the heat transfer member 1720 and may disperse the waste heat in at least one region of the noncontact part 1615. That is, the heat transfer member 1720a expands the heat transfer path formed by the heat transfer member 1720 to at least one region of the noncontact part 1615 to disperse the waste heat, thereby increasing a region through which the waste heat is dissipated. An area through which the waste heat is dissipated may be increased, thereby increasing a heat dissipation efficiency of the waste heat.

In addition, the heat transfer member 1720a may also be disposed inside or outside the ring member 1610-2b or 1610-3b according to a design, like the heat transfer member 1720.

In addition, the heat transfer member 1720a may not be connected to other components of the feedback device 1600-2 or 1600-3, specifically, a battery, a sensor, a substrate, and a processor inside the ring member 1610-2b or 1610-3b. Accordingly, the other components may be insulated from the waste heat and not be thermally degraded by the waste heat.

3.4. Heat Dissipation Part

As described above, waste heat generated in a heat output module 1640 may be dissipated from a noncontact part 1615 of a casing 1610.

A heat dissipation part may be configured to emit the waste heat and may be formed in the noncontact part 1615. For example, the heat dissipation part may be disposed inside or outside the noncontact part 1615 in the form of a heat dissipation member. In addition, the heat dissipation part may not be a separate element from the noncontact part 1615 but may be a portion of the noncontact part 1615.

Hereinafter, various configurations of the heat dissipation part will be described. For convenience of description, various configurations of the heat dissipation part will be described with reference to the separate drawings, but the present invention is not limited thereto. The heat dissipation part may be implemented as a combination of various configurations to be described below.

3.4.1. Heat Dissipation Part: Heat Dissipation Sheet

Figure 24:
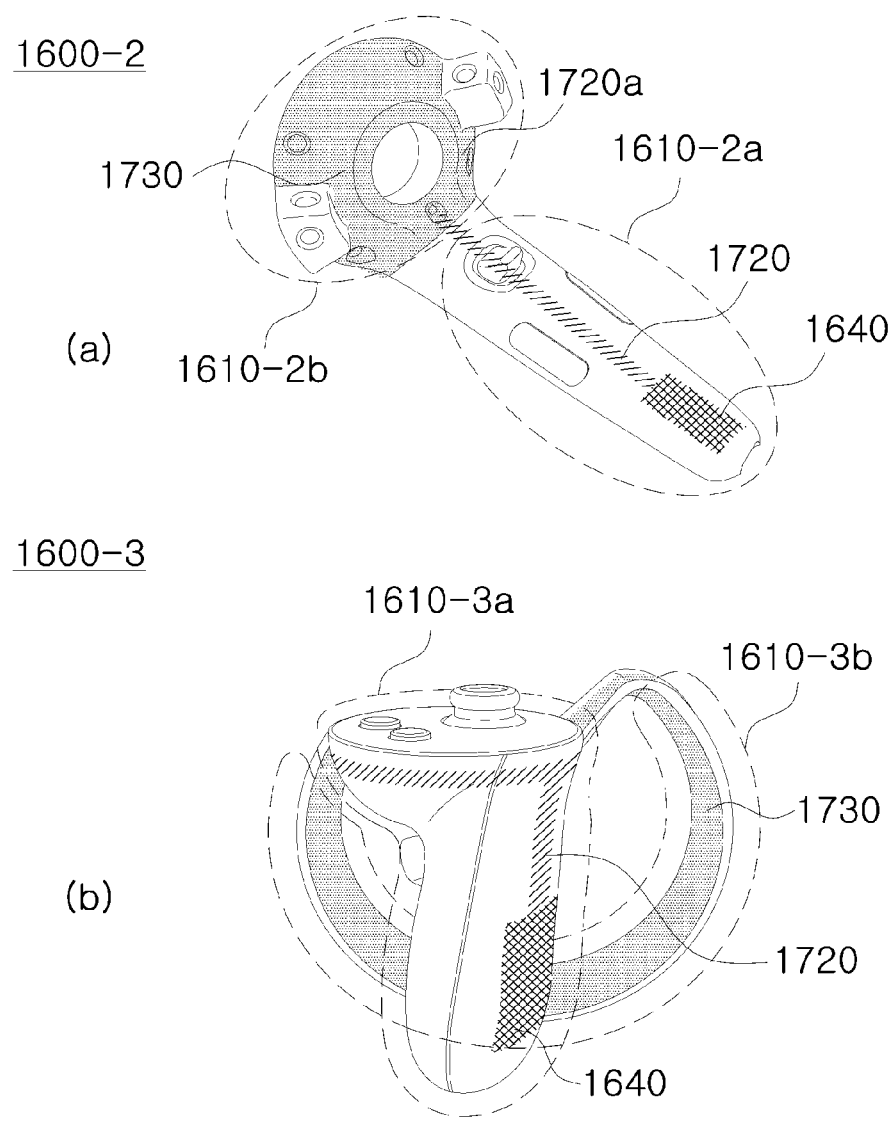
FIGS. 24 to 26 are views illustrating examples in which a heat dissipation sheet according to an exemplary embodiment of the present invention is applied.
Figure 25:
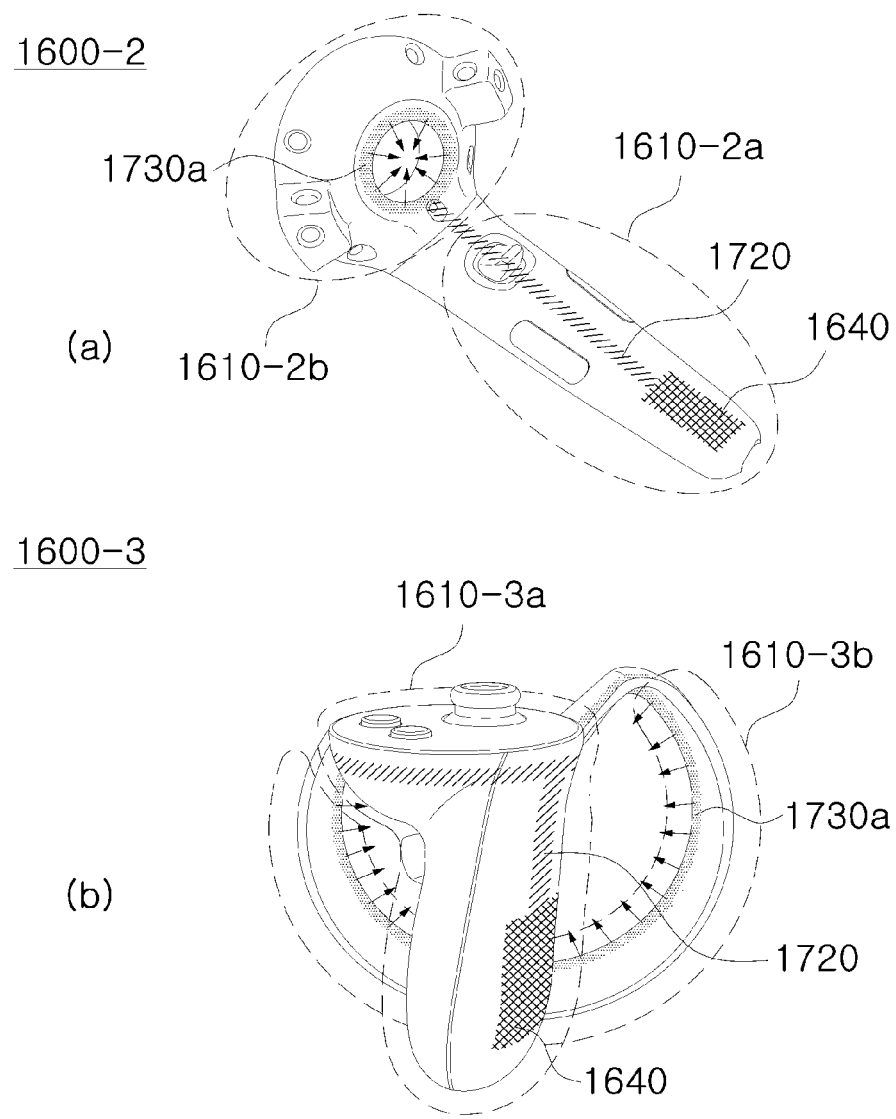
Figure 26:
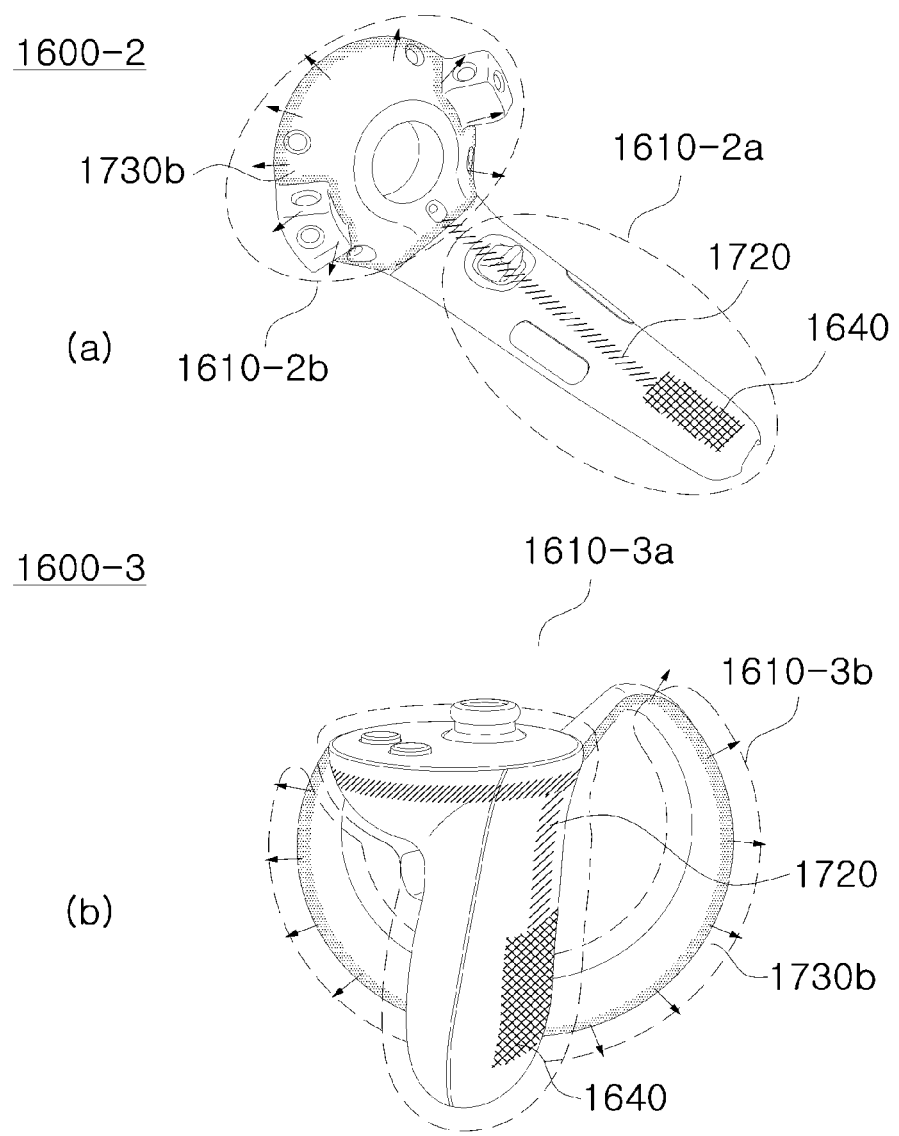

FIGS. 24 to 26 are views illustrating examples in which a heat dissipation sheet according to an exemplary embodiment of the present invention is applied.

Referring to FIG. 24, (a) illustrates an example in which a heat dissipation sheet 1730 is provided in a feedback device 1600-2. (b) illustrates an example in which a heat dissipation sheet 1730 is disposed in a feedback device 1600-3.

For convenience of description, an arrangement of a heat output module 1640, a heat transfer member 1720, and a heat dissipation sheet 1730 in the feedback devices 1600-2 and 1600-3 including a stick member and a ring member will be described with reference to FIGS. 24 to 26. However, the present invention is not limited thereto, and content described with reference to FIGS. 24 to 26 may be applied as it is even when a casing 1610 includes other members such as a cylindrical member or the like. In addition, the heat transfer member 1720 is illustrated in FIGS. 24 to 26 as being included in the feedback devices 1600-2 and 1600-3, but the present invention is not limited thereto. The heat transfer member 1720 may not be included in the feedback devices 1600-2 and 1600-3.

In (a) and (b), stick members 1610-2a and 1610-3a may be set as contact parts 1611, and ring members 1610-2b and 1610-3b may be set as noncontact parts 1615.

In addition, a heat transfer part may be formed from the contact part 1611 in which a heat output module 1640 is disposed to the noncontact part 1615 so that waste heat may be transferred from the heat output module 1640 to the noncontact part 1615.

However, the waste heat is transferred only to a portion, which is connected to the heat output module 1640, or the heat transfer part among an entire region of the noncontact part 1615. When the noncontact part 1615 has low heat conductivity, the waste heat may be dissipated only through one region of the noncontact part 1615. Thus, a dissipation effect of the waste heat may be lowered. In addition, due to a material property of the noncontact part 1615, when heat dissipation performance is low, a dissipation effect of the waste heat may be low.

In the present invention, the heat dissipation sheet 1730 may be disposed inside or outside the noncontact part 1615 in order to improve the dissipation effect of the waste heat. Herein, the heat dissipation sheet 1730 may be a kind of a heat dissipation member having a heat dissipation function of dissipating heat to the outside and may mean a heat dissipation member formed in a sheet shape. For example, the heat dissipation sheet 1730 may have a film shape (for example, a polyimide (PI) film), a thin film shape, a plate shape, or the like. In addition, the heat dissipation sheet 1730 may be composed of a thin plate made of a metal such as copper, or aluminum having high heat transfer coefficient, may be made of other metals or a non-metal material or may be made of a metal net or a metal mesh shape as needed. In an example, the heat dissipation sheet 1730 may be referred to as a heat dissipation plate.

In addition, the heat dissipation sheet 1730 may disperse waste heat transferred to at least one region of the heat dissipation sheet 1730 in a region wider than the at least one region of the heat dissipation sheet 1730 (for example, an entire region of the heat dissipation sheet 1730) and then may dissipate the dispersed waste heat through an entire region of the heat dissipation sheet 1730.

In an exemplary embodiment, the heat dissipation sheet 1730 may be disposed in an inner or outer entire region of the noncontact part 1615 such that the waste heat is dissipated from a wide region of the noncontact part 1615. Accordingly, when the waste heat is transferred to one region of the heat dissipation sheet 1730, the heat dissipation sheet 1730 may disperse the waste heat in an entire region of the heat dissipation sheet 1730 and may dissipate the waste heat. The heat dissipation sheet 1730 may be disposed in the entire region of the noncontact part 1615, and thus, the waste heat may be dissipated from an entire region of the noncontact part 1615. In summary, the waste heat may be dispersed in the entire region of the noncontact part 1615 by the heat dissipation sheet 1730, and the dispersed heat may be dissipated through the heat dissipation sheet 1730 and the noncontact part 1615. Accordingly, even when heat dissipation performance of the noncontact part 1615 is low, a waste heat dissipation effect of the noncontact part 1615 may be improved by the heat dissipation sheet 1730.

In addition, in an exemplary embodiment of the present invention, the heat dissipation sheet 1730 may be disposed in a recess 1610-10b described with reference to FIG. 20. In this case, the heat dissipation sheet 1730 disposed in the recess 1610-10b may receive waste heat from the heat output module 1640 or may receive waste heat from the heat transfer member 1720 when the heat transfer member 1720 is connected between the heat output module 1640 and the heat dissipation sheet 1730. The heat dissipation sheet 1730 may dissipate the received waste heat through the recess 1610-10b. Accordingly, a waste heat dissipation effect in the recess 1610-10b may be improved.

FIGS. 25 and 26 are views illustrating examples in which a heat dissipation sheet 1730 according to an exemplary embodiment of the present invention is applied to a partial region of a noncontact part 1615.

While an example in which the heat dissipation sheet 1730 is disposed on the entirety of the noncontact part 1615 has been described with reference to FIG. 24, as illustrated in FIGS. 25 and 26, the heat dissipation sheet 1730 may be disposed in a partial region of the noncontact part 1615, and waste heat may be dissipated from the partial region. That is, a dissipation region of waste heat may be determined according to an arrangement region and an arrangement position of the heat dissipation sheet 1730.

Referring to FIG. 25, in (a), a heat dissipation sheet 1730a may be disposed on an inner side of a ring member 1610-2b which is a noncontact part 1615, i.e., disposed in a surrounding region of a cavity of the ring members 1610-2b.

In addition, in (b), the heat dissipation sheet 1730a may be disposed on an inner side of a ring member 1610-3b which is a noncontact part 1615.

Since the heat dissipation sheet 1730a is disposed on the inner sides of the ring members 1610-2b and 1610-3b, waste heat generated in a heat output module 1640 formed in a contact part 1611 is transferred to the inner sides of the ring members 1610-2b and 1610-3b, in which the heat dissipation sheets 1730a are disposed. Thus, the waste heat is dissipated from the inner sides of the ring members 1610-2b and 1610-3b, and the waste heat is not dissipated from outer sides of the ring members 1610-2b and 1610-3b.

In some cases, when the waste heat is dissipated from the outer sides of the ring members 1610-2b and 1610-3b, other users rather than the current user may come into contact with the outer sides of the ring members 1610-2b and 1610-3b. Thus, other users may feel the waste heat. On the contrary, when the waste heat is dissipated from the inner sides of the ring members 1610-2b and 1610-3b, although other users may come into contact with the outer sides of the ring members 1610-2b and 1610-3b, the other users do not feel the waste heat. Accordingly, when the heat dissipation sheet 1730a is disposed on the inner sides of the ring members 1610-2b and 1610-3b, the influence of the waste heat on the other users may be minimized.

On the contrary, referring to FIG. 26, in (a), a heat dissipation sheet 1730b may be disposed on an outer side of a ring member 1610-2b which is a noncontact part 1615. In addition, in (b), the heat dissipation sheet 1730b may be disposed an outer side of a ring member 1610-3b which is a noncontact part 1615.

Since the heat dissipation sheet 1730b is disposed on the outer sides of the ring members 1610-2b and 1610-3b, waste heat generated in a heat output module 1640 formed in a contact part 1611 is transferred to the outer sides of the ring members 1610-2b and 1610-3b in which the heat dissipation sheet 1730*a* is disposed. Thus, the waste heat is dissipated from the outer sides of the ring members 1610-2*b* and 1610-3*b*, and the waste heat is not dissipated from inner sides of the ring members 1610-2*b* and 1610-3*b*.

According to a design of a feedback device, when the waste heat is transferred to the inner side of the ring members 1610-2*b* and 1610-3*b*, in which the heat dissipation sheet 1730*b* is disposed, the waste heat may be transferred to a user. On the contrary, when the waste heat is dissipated from the outer sides of the ring members 1610-2*b* and 1610-3*b*, the waste heat may not be transferred to the user. For example, since the contact part 1611 is formed on the inner side of the ring member 1610-3*b* that is the noncontact part 1615 in a feedback device 1600-2, when the waste heat is dissipated from the outer side of the ring member 1610-3*b*, the waste heat may not be transferred to the user.

In addition, since an area of the outer sides of the ring members 1610-2*b* and 1610-3*b* are greater than that of the inner sides of the ring members 1610-2*b* and 1610-3*b*, when the waste heat is dissipated from the outer sides of the ring members 1610-2*b* and 1610-3*b* rather than the inner sides of the ring members 1610-2*b* and 1610-3*b*, the waste heat may be dissipated from a wider area.

Accordingly, when the heat dissipation sheet 1730*b* is disposed on the outer sides of the ring members 1610-2*b* and 1610-3*b*, the influence of the waste heat on the user may be minimized, and a waste heat dissipation effect of the noncontact part 1615 may be improved.

3.4.2. Heat Dissipation Part: Noncontact Part Including Material with High Heat Dissipation Performance FIG. 27 is a view illustrating an example of a noncontact part including a material with high heat dissipation performance according to an exemplary embodiment of the present invention.

Referring to FIG. 27, as described above, a heat dissipation part may be formed as a portion of a noncontact part 1615. In an example of FIG. 27, the heat dissipation part may be a member 1740 having high heat dissipation performance and the member 1740 having high heat dissipation performance may be formed as the noncontact part 1615, i.e., a portion of a casing 1610.

Herein, the member 1740 having the high heat dissipation performance may be made of at least one selected from metal materials such as aluminum, gold, copper, lead, stainless steel, SS316, silver, and steel, inorganic materials such as beryllium oxide, aluminum nitride, silicon carbide, and alumina, and a non-conductive material such as diamond.

In addition, it can be understood that as a dissipation amount per unit time of the waste heat is increased in a certain area, the heat dissipation performance is increased.

As described above, the waste heat is dissipated from at least a portion of the noncontact part 1615. Accordingly, a dissipation time and a dissipation amount of the waste heat may be changed according to heat dissipation performance of at least the portion of the noncontact part 1615, from which the waste heat is dissipated.

In an exemplary embodiment, as shown in (a), the member 1740 having the high heat dissipation performance may be formed on the entirety of the noncontact part 1615. In this case, the entirety of the noncontact part 1615 may have high dissipation performance.

In another exemplary embodiment, as shown in (b), the member 1740 having the high heat dissipation performance may be formed at a portion of the noncontact part 1615. That is, the noncontact part 1615 may be made of two or more materials, and the member 1740 having the high heat dissipation performance may be made of a material different from other regions of the noncontact part 1615. In this case, among members of the noncontact part 1615, the member 1740 having the high heat dissipation performance may have higher heat dissipation performance than other members of the noncontact part 1615. Accordingly, waste heat may be concentrically dissipated from the member 1740 having the high heat dissipation performance.

In addition, a heat transfer member may be thermally connected to the member 1740 having the high heat dissipation performance such that the waste heat is transferred to the member 1740 having the high heat dissipation performance. The member 1740 having the high heat dissipation performance may receive the waste heat from the heat transfer member. Therefore, the waste heat may be dissipated at high heat dissipation performance from the member 1740 having the high heat dissipation performance.

3.4.3. Heat Dissipation Part: Noncontact Part Including Patterns

FIG. 28 is a view illustrating an example in which patterns according to an exemplary embodiment of the present invention are applied.

Referring to FIG. 28, (a) illustrates an example in which patterns 1750 are disposed in a feedback device 1600-2, and (b) illustrates an example in which patterns 1750 are disposed in the feedback device 1600-3.

For convenience of description, an arrangement of the patterns 1750 in the feedback devices 1600-2 and 1600-3 including a stick member and a ring member will be described with reference to FIG. 28. However, the present invention is not limited thereto, and content described with reference to FIG. 28 may be applied as it is even when a casing 1610 includes other members such as a cylindrical member.

In (a) and (b), ring members 1610-2*b* and 1610-3*b* may be set as noncontact parts 1615.

In the present invention, the patterns 1750 may be formed to pass from an inner surface to an outer surface of the noncontact part 1615 in order to expand a dissipation area of the waste heat.

The patterns 1750 may include engraved patterns and/or embossed patterns in the noncontact part 1615 of the casing 1610. In addition, the patterns 1750 may be formed in various shapes such as a circle, a polygon, and a linear shape, and the number of the patterns 1750 may be at least one. In addition, the pattern 1750 may be formed on the inner side and/or the outer side of the noncontact part 1615.

As described above with reference to FIG. 27, since a heat dissipation part may be formed as a portion of the noncontact part 1615, the patterns 1750, which are a kind of the heat dissipation part, may be formed as the noncontact part 1615, i.e., a portion of the casing 1610.

In addition, as described above, the noncontact part 1615 may dissipate the waste heat. Since the waste heat is dissipated from at least one region of the noncontact part 1615, waste heat dissipation performance may be changed according to an area of the at least one region of the noncontact part 1615. In some cases, a position of the at least one region of the noncontact part 1615 may be fixed, and thus, the area of the at least one region may also be fixed. However, when the patterns 1750 pass through the at least one region, a surface area of the at least one region may be increased due to the patterns 1750. Accordingly, the waste heat may be dissipated from the patterns 1750, and a waste heat dissipation area of the noncontact part 1615 may be increased by the patterns 1750. As the waste heat dissipation area is increased, waste heat dissipation performance in the noncontact part 1615 may be improved.

Furthermore, a heat transfer member 1720 connected to a heat output module 1640 may be connected to the patterns 1750 such that the waste heat is dissipated from the patterns 1750. Of course, the heat transfer member 1720 may not be connected to the patterns 1750, and the waste heat may be transferred from the heat output module 1640.

In addition, since the waste heat may be dissipated from the patterns 1750, a heat dissipation sheet 1730 may be disposed inside and/or outside the patterns 1750 in order to improve waste heat dissipation performance of the patterns. The patterns may be composed of the member 1740 having the high heat dissipation performance.

Furthermore, in an exemplary embodiment of the present invention, a sensing module 1630 may be disposed in the noncontact part 1615. Since the patterns 1750 include engraved patterns and/or embossed patterns, the sensing module 1630 may be accurately disposed at a certain position based on a position of the patterns 1750. In addition, in some cases, the sensing module 1630 may be fixed to the engraved patterns and/or the embossed patterns of the patterns 1750. When the sensing module 1630 is heat-resistant, the sensing module 1630 may be designed such that the waste heat is dissipated from a pattern to which the sensing module 1630 is fixed. Otherwise, the sensing module 1630 may be designed such that the waste heat is not dissipated from the pattern to which the sensing module 1630 is fixed.

3.4.4. Heat Dissipation Part: Noncontact Part Including Hollow Portion

FIG. 29 is a view illustrating an example in which hollow portion according to an exemplary embodiment of the present invention are applied.

Referring to FIG. 29, (a) illustrates an example in which hollow portion 1760 are formed in a feedback device 1600-2, and (b) illustrates an example in which hollow portion 1760 are formed in the feedback device 1600-3.

For convenience of description, an arrangement of the hollow portion 1760 in the feedback devices 1600-2 and 1600-3 including a stick member and a ring member will be described with reference to FIG. 29. However, the present invention is not limited thereto, and content described with reference to FIG. 29 may be applied as it is even when a casing 1610 includes other members such as a cylindrical member.

In (a) and (b), ring members 1610-2b and 1610-3b may be set as noncontact parts 1615.

In the present invention, the hollow portion 1760 may be formed to pass from an inner surface to an outer surface of the noncontact part 1615 in order to expand a dissipation area of the waste heat.

The hollow portion 1760 may pass from an inner side to an outer side of the noncontact part 1625 of the casing 1610 and may be formed in various shapes such as a circular, a polygonal, or linear shape. In addition, the number of the hollow portion 1760 may be at least one.

As described above with reference to FIG. 27, since a heat dissipation part may be formed as a portion of the noncontact part 1615, the hollow portion 1760, which are a kind of the heat dissipation part, may be formed as the noncontact part 1615, i.e., a portion of the casing 1610.

In addition, as described above, since the waste heat is dissipated from the noncontact part 1615 and is dissipated from at least one region of the noncontact part 1615, the waste heat dissipation performance may be changed according to an area of the at least one region of the noncontact part 1615. When the hollow portion 1760 passes through the at least one region of the noncontact part 1615, a surface area of the at least one region may be increased due to the hollow portion 1760. The waste heat may be dissipated from the hollow portion 1760 or surrounding region of the hollow portion 1760, and a waste heat dissipation area of the noncontact part 1615 may be increased due to the hollow portion 1760. As the waste heat dissipation area is increased, the waste heat dissipation performance in the noncontact part 1615 may be improved.

Furthermore, a heat transfer member 1720 connected to a heat output module 1640 may be connected to the hollow portion 1760 such that the waste heat is dissipated from the hollow portion 1760.

In addition, when the waste heat is emitted from the surrounding region of the hollow portion 1760, the heat transfer member 1720 connected to the heat output module 1640 may be connected to the surrounding region of the hollow portion 1760. Of course, the heat transfer member 1720 may not be connected to the hollow portion 1760 or the surrounding region of the hollow portion 1760, and the waste heat may be transferred from the heat output module 1640.

3.4.5. Heat Dissipation Part: Heat Dissipation Fins

FIG. 30 is a view illustrating an example in which heat dissipation fins are applied to a noncontact part according to an exemplary embodiment of the present invention.

Referring to FIG. 30, an arrangement of heat dissipation fins 1770 when a casing 1610-1 of a feedback device 1600-1 is a cylindrical member will be described with reference to (a), and an arrangement of the heat dissipation fins 1770 when a noncontact part 1615 of a casing 1600-2 of a feedback device 1600-2 is a ring member 1610-2b will be described with reference to (b). However, the present invention is not limited to this, and content described with reference to FIG. 30 may be applied as it is even when a casing 1610 includes other members rather than the cylindrical member and the ring member.

Herein, the heat dissipation fins 1770 may be a kind of a heat dissipation part and may be referred to as a cooling fin in some cases.

In (a), a heat output module 1640 may be formed on an inner surface of the casing 1610-1, and waste heat may be generated in the heat output module 1640. In addition, a cavity 1810 may be formed in the casing 1610-1, and the waste heat may be dissipated to the outside through the cavity 1810. That is, the cavity 1810 may become a noncontact part 1615.

In addition, the heat dissipation fins 1770 may be provided on the inner surface of the casing 1610-1. Specifically, the waste heat may be generated in the heat output module 1640, and the waste heat may be transferred to the heat dissipation fins 1770. The waste heat transferred to the heat dissipation fins 1770 is discarded in air of the cavity 1810 from surfaces of the heat dissipation fins 1770 through a convective heat transfer. Since the heat dissipation fins 1770 have a wide heat exchange area due to a shape thereof, convective heat dissipation efficiency, that is, heat dissipation efficiency of the waste heat, may be increased.

In addition, a heat-conductive layer 1641a and 1641b may be additionally provided on the inner surface of the casing 1610-1. The heat-conductive layer 1641a may be disposed between a heat output module 1640 and the casing 1610-1 to expand an effect of an exothermic or endothermic operation performed by the heat output module 1640 to a wider area of the casing 1641a. Furthermore, the heat-conductive layer 1641b may be disposed between the heat output module 1640 and the heat dissipation fins 1770 to disperse and transfer the waste heat generated in the heat output module 1640 to a wider area of the heat dissipation fins 1770. Accordingly, since the waste heat is transferred to the wider area of the heat dissipation fins 1770, heat dissipation efficiency of the waste heat in the heat dissipation fins 1770 may be improved.

In (b), a heat output module 1640 may be formed on an inner surface of a ring member 1610-2*b*, and waste heat may be generated in the heat output module 1640. In addition, a cavity 1810 may be formed in the ring member 1610-2*b*, and the waste heat may be dissipated to the outside through the cavity 1810. That is, the cavity 1810 may become a non-contact part 1615.

In addition, the heat dissipation fins 1770 may be provided in the ring member 1610-2*b*. As shown in (b), a heat transfer member 1720 may be disposed between the heat dissipation fins 1770 and the ring member 1610-2*b*. In this case, the heat dissipation fins 1770 receives the waste heat from the heat transfer member 1720 and may dissipate the waste heat. As described above, since the heat dissipation fins 1770 have the wide heat exchange area due to the shape thereof, the heat dissipation fins 1770 may be included in the ring member 1610-2*b*. Thus, heat dissipation efficiency of the waste heat may be improved due to the heat dissipation fins 1770.

In addition, the heat transfer member 1720 is illustrated in (b) as being disposed along an entire circumference of the heat dissipation fins 1770. However, the present invention is not limited thereto, and the heat transfer member 1720 may be disposed at a portion of the circumference of the heat dissipation fins 1770.

Furthermore, in another example, the heat transfer member 1720 may not exist between the heat dissipation fins 1770 and the ring member 1610-2*b*, and the heat dissipation fins 1770 may receive the waste heat from the ring member 1610-2*b*.

In addition, while the heat dissipation fins 1770 are illustrated as being fitted in the ring member 1610-2*b*, the present invention is not limited thereto, and the heat dissipation fins 1770 may be disposed in any shape in the ring member 1610-2*b*. For example, the heat dissipation fins 1770 may be formed in a shape surrounding the cavity 1810.

The heat dissipation fins 1770 may be disposed on an outer side of the ring member 1610-2*b*. In addition, the heat dissipation fins 1770 may protrude from the ring member 1610-2*b* to be visible to a user or may be disposed inside the ring member 1610-2*b* so as to not visible to the user.

3.4.6. Heat Dissipation Part: Heat Dissipation Fan

Figure 31:
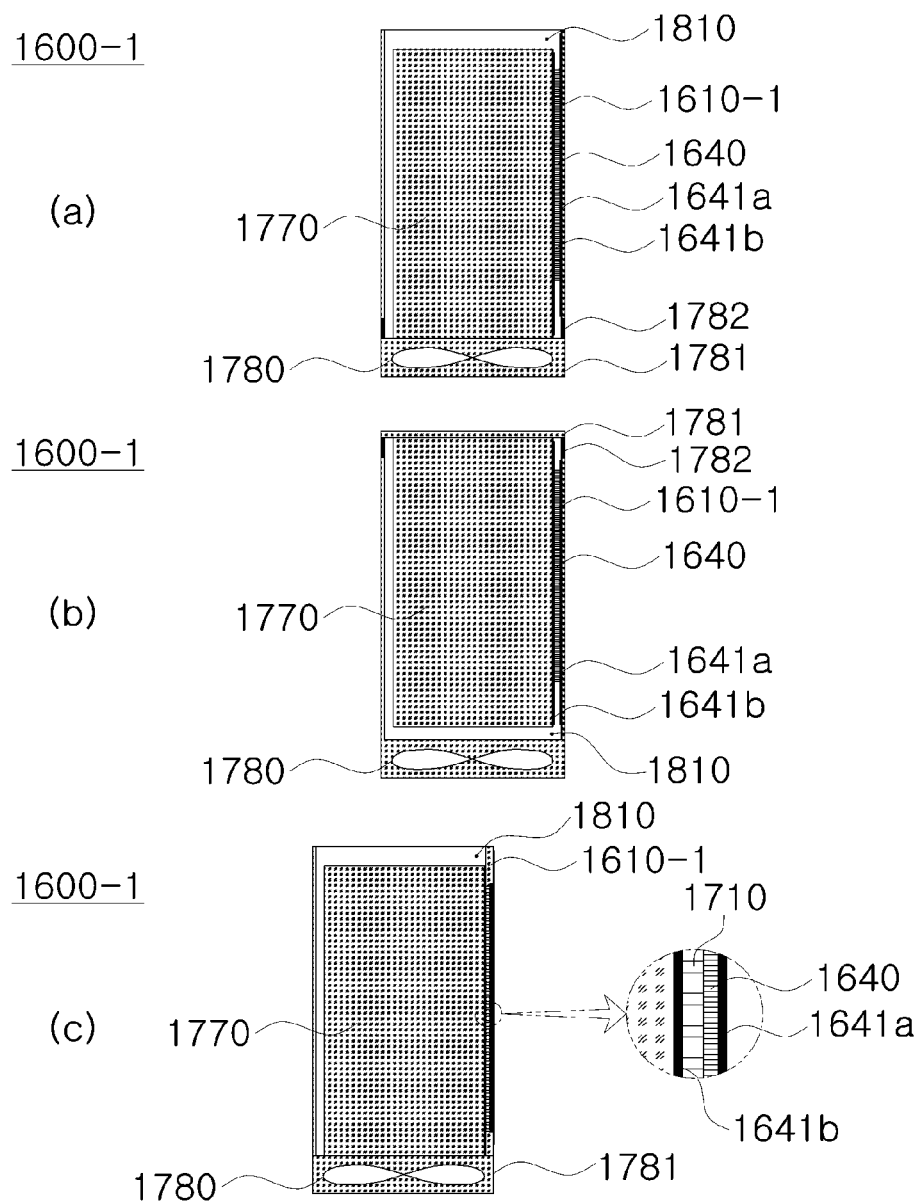

FIGS. 31 and 32 are views illustrating examples in which a heat dissipation fan 1780 is applied according to an exemplary embodiment of the present invention.

An arrangement of the heat dissipation fan 1780 when a casing 1610-1 of a feedback device 1600-1 is a cylindrical member will be described with reference to FIGS. 31 and 32. However, the present invention is not limited thereto, and content described with reference to FIG. 31 may be applied as it is even when the casing 1610 includes another member rather than a cylindrical member.

Herein, the heat dissipation fan 1780 may be a kind of a heat dissipation part and may be referred to as a cooling fan in some cases.

In FIGS. 31 and 32, the heat dissipation fan 1780 may be provided at one end of a cavity 1810 to forcibly circulate air through the cavity 1810. Thus, a waste heat release effect of the cavity 1810 may be improved. In this case, the heat dissipation fan 1780 may receive driving power from a power module 1680 as described above.

In addition, heat dissipation fins 1770 as described above with reference to FIG. 30 may be additionally provided in the cavity 1810. In this case, the waste heat dissipation effect may be further improved.

Specifically, when only the heat dissipation fins 1770 are provided in the cavity 1810, heat transferred from a heat output module 1640 may be discarded in air filling the cavity 1810 through the heat dissipation fins 1770, and the air may escape to an outside space (that is, heat is discarded in the outside space). Thus, the cavity 1810 may perform a waste heat dissipation function to a certain level. However, when the air in the cavity 1810 cannot smoothly flow to the external space, the heat may not be smoothly discarded. In this case, when the air in the cavity 1810 flows through the heat dissipation fan 1780, the heated air smoothly escapes and fresh air is filled therein, heat may be actively absorbed again. Thus, much more efficient cooling may be performed.

More specifically, since heat transfer efficiency in the heat dissipation fins 1770 is directly related to velocity of air around the heat dissipation fins 1770, the air may flow due to the heat dissipation fan 1780, thereby improving the heat transfer efficiency in the heat dissipation fins 1770 to considerably improve waste heat dissipation performance.

Referring to FIG. 31, (a) and (b) illustrate examples in which a heat-conductive layer 1641*a* and 1641*b* and a heat output module 1640 are disposed in a casing 1610-1. (C) illustrates an example in which a heat transfer structure 1710 is embedded in a wall of a casing 1610-1.

In (a) to (c), a support 1781 configured to fix and support heat dissipation fins 1770 may be provided on an upper surface or a lower surface of the casing 1610-1. More specifically, (a) and (c) illustrate a case in which the support 1781 is provided on the lower surface of the casing 1610-1. (b) illustrates a case in which the support 1781 is provided on the upper surface of the casing 1610-1. In addition, the heat dissipation fan 1780 is illustrated in (a) and (c) as also being supported and provided on the support 1781. The heat dissipation fan 1780 is illustrated in (b) as being supported and provided on a structure separately connected to the casing 1610-1 rather than the support 1781. Of course, the present invention is not limited to the examples of (a) to (c), and the present invention may be appropriately modified.

In some cases, when the heat dissipation fins 1770 are fixedly supported by the support 1781, a portion of the waste heat emitted from the heat output module 1640 may sequentially pass through the heat dissipation fins 1770 and the support 1781 and return to the casing 1610-1. In this case, a portion of the waste heat may be transferred to a user who grips the casing 1610-1, thereby reducing a thermal experience of the user.

In order to solve such a problem, a feedback device 1600-1 may further include a heat insulation part 1782 provided at a connection portion between the casing 1610-1 and the support 1781. As shown in (a) to (c), since the heat dissipation fins 1770 and the support 1781 are connected to each other and the support 1781 and the casing 1610-1 are insulated from each other by the heat insulation part 1782, although the waste heat is transferred from the heat dissipation fins 1770 to the support 1781, the waste heat is not transferred to the casing 1610-1 due to the heat insulation part 1782. Therefore, due to the support 1781, the waste heat may not be transferred to a user.

Referring to FIG. 32, (a) illustrates an example in which a heat-conductive layer 1641*a* and 1641*b* and a heat output module 1640 are disposed in a casing 1610-1. (b) illustrates an example in which a heat transfer structure 1710 is embedded in a wall of a casing 1610-1.

Specifically, in (a), heat dissipation fins 1770 and the heat output module 1640 should be in close contact with each other in order to improve waste heat dissipation performance. However, when the heat dissipation fins 1770 are assembled in such a manner that the heat dissipation fins 1770 are pushed into the cavity 1810, while the heat dissipation fins 1770 are pushed in a state in which the heat dissipation fins 1770 and the heat output module 1640 are in close contact with each other, excessive stress may be applied to the heat output module 1640 to damage the heat output module 1640.

Furthermore, in (b), the heat dissipation fins 1770 and the casing 1610-1 should be in close contact with each other. However, similarly, while the heat dissipation fins 1770 are pushed, excessive stress may be applied to an inner wall of the casing 1610-1 to damage the inner wall of the casing 1610-1.

In addition, in (a), a distance between the heat dissipation fins 1770 and the heat output module 1640 is designed so as to be long, or in (b), when a distance between the heat dissipation fins 1770 and the casing 1610-1 is designed so as to be long, waste heat may not be smoothly transferred to the heat dissipation fins 1770.

In order to solve such problems, in the present invention, as shown in (a) and (b), in the feedback device 1600-1, an inner surface of the cavity 1810 is formed to have a tapered shape in an extending direction of the casing 1610-1, and an outer surface of the heat dissipation fins 1770 is formed to have a tapered shape so as to correspond to the inner surface of the cavity 1810.

When the inner surface of the cavity 1810 and the outer surface of the heat dissipation fins 1770 have the tapered shape so as to correspond to each other, in (a), while the heat dissipation fins 1770 are pushed into the cavity 1810 in an arrow direction, stress may not be applied to the heat output module 1640. In addition, in (b), stress may not be applied to the heat output module 1640 and the inner wall of the casing 1610-1.

Furthermore, when the heat dissipation fins 1770 are completely pressed against the heat output module 1640, the heat dissipation fins 1770 may not be pushed further. Accordingly, through the tapered shape as shown in (a) and (b), stress may be not applied to any component during an assembly process, and after assembly completion, components may be in close contact with each other, thereby concurrently improving assemblability and a waste heat transfer effect.

Methods according to exemplary embodiments may be implemented in the form of program instructions executable through diverse computing means and may be recorded in computer readable media. The computer readable media may include, independently or in combination, program instructions, data files, data structures, and so on. Program instructions recorded in the media may be specially designed and configured for embodiments, or may be generally known by those skilled in the computer software art. Computer readable recording media may include magnetic media such as hard disks, floppy disks, and magnetic tapes, optical media such as CD-ROM and DVD, magneto-optical media such as floptical disks, and hardware units, such as ROM, RAM, flash memory, and so on, which are intentionally formed to store and perform program instructions. Program instructions may include high-class language codes executable by computers using interpreters, as well as machine language codes likely made by compilers. The hardware units may be configured to function as one or more software modules for performing operations according to embodiments of the present disclosure, and vice versa.

While exemplary embodiments have been shown and described with reference to the accompanying drawings thereof, it will be understood by those skilled in the art that various changes and modifications in form and details may be made therein without departing from the spirit and scope of the present invention as defined by the appended claims and their equivalents. For example, desired results may be achieved even if the exemplary embodiments of the present invention are performed in other sequences different from the descriptions, and/or the elements, such as system, structure, device, circuit, and so on, are combined or assembled in other ways different from the descriptions, or replaced or substituted with other elements or their equivalents. Therefore, other implementations, other embodiments, and equivalents of the appended claims may be included in the scope of the appended claims.

The invention claimed is:

1. A feedback device providing a thermal experience according to a thermal event to a user in accordance with reproduction of multimedia content including the thermal event, the feedback device comprising:
   a casing including a contact part that is a region with which the user comes into contact in a case in which the feedback device is moved when the content is reproduced and including a noncontact part that is a region with which the user does not come into contact although the feedback device is moved when the content is reproduced;
   a heat output module including a first substrate and a second substrate having flexibility, a thermoelectric element disposed between the first substrate and the second substrate and configured to perform a thermoelectric operation for the thermal feedback, wherein the thermoelectric operation includes an exothermic operation and an endothermic operation, and a contact surface disposed on the second substrate, wherein
   the heat output module is disposed inside or outside a curved shape of the contact part due to the flexibility of the first substrate and the second substrate and transfers heat generated by the thermoelectric operation to the user through the second substrate and the contact surface to output the thermal feedback;
   a feedback controller configured to control the heat output module;
   a heat dissipation unit configured to dissipate waste heat from the noncontact part when the waste heat is generated toward the first substrate as the thermoelectric element performs the endothermic operation such that temperature of at least a portion of the contact surface is less than a certain temperature, wherein:
      the waste heat indicates the remaining heat, except for heat for providing the thermal feedback among the heat generated in the thermoelectric element; and
      the heat dissipation unit includes a heat transfer part configured to form a heat transfer path from the heat output module to the noncontact part such that the waste heat is transferred from the heat output module to the noncontact part; and
   a heat dissipation part configured to dissipate the waste heat received through the heat transfer path, wherein the waste heat is moved along the heat transfer path from the contact part to the noncontact part in which the heat output module is disposed and is dissipated from the noncontact part.

2. The feedback device of claim 1, wherein:
the heat transfer part includes a first heat transfer member disposed in the contact part and a second heat transfer member disposed in the noncontact part and connected to the first heat transfer member,
the first heat transfer member transfers the waste heat from the heat output module to the first heat transfer member, and
the second heat transfer member receives the waste heat from the first heat transfer member and disperses the waste heat in at least one region of the noncontact part.

3. The feedback device of claim 1, wherein:
the noncontact part has an empty space in an inside thereof, and
when the heat output module is disposed on an outer surface of the contact part and a thickness of the heat output module is smaller than a wall thickness of the contact part, the heat transfer part includes a heat transfer structure embedded in a wall of the contact part such that one end thereof is connected to the heat output module and the other end thereof is exposed in the empty space in the inside.

4. The feedback device of claim 1, wherein:
the heat dissipation part includes a heat dissipation sheet disposed in the noncontact part and configured to dissipate the waste heat to the outside, and
at least one region of the heat dissipation sheet is connected to the heat transfer part to receive the waste heat from the heat transfer part, and the heat dissipation sheet dissipates the waste heat from a region thereof which is wider than the at least one region of the heat dissipation sheet.

5. The feedback device of claim 4, wherein, when the noncontact part has an empty space in an inside thereof, the heat dissipation sheet is disposed in the inside and dissipates the waste heat received from the heat transfer part from the inside such that the waste heat is not transferred to the user.

6. The feedback device of claim 4, wherein, when the contact part is formed on an inner side of the noncontact part, the heat dissipation sheet is disposed on an outer side of the noncontact part and dissipates the waste heat received from the heat transfer part from the outer side such that the waste heat is not transferred to the user.

7. The feedback device of claim 1, wherein:
when the noncontact part has an empty space in an inside thereof, the heat dissipation part includes heat dissipation fins disposed to face the empty space in the inside, and
at least one region of the heat dissipation fins is connected to the heat transfer part to receive the waste heat from the heat transfer part, and the heat dissipation fins dissipate the waste heat to the empty space in the inside from a region thereof which is wider than the at least one region of the heat dissipation fins.

8. The feedback device of claim 1, wherein:
the heat dissipation part includes a heat dissipation fan configured to forcibly circulate the waste heat, and
when the noncontact part has an empty space in an inside thereof, the waste heat forcibly circulated by the heat dissipation fan is dissipated through the empty space in the inside.

9. The feedback device of claim 1, wherein:
the heat dissipation part is formed as a portion of the noncontact part, and
the heat dissipation unit is made of a material having heat dissipation performance higher than heat dissipation performance of other portions of the noncontact part.

10. The feedback device of claim 1, wherein the heat dissipation part is formed as a portion of the noncontact part and has at least one hollow portion for expanding a dissipation area of the waste heat.

11. The feedback device of claim 1, wherein:
the heat dissipation part is a portion of the noncontact part, is formed on an inner side or an outer side of the noncontact part, and includes at least one engraved pattern or at least one embossed pattern for expanding a dissipation area of the waste heat, and
the waste heat is dissipated through the at least one engraved pattern or the at least one embossed pattern.

12. The feedback device of claim 1, wherein, when the casing includes a stick member and the stick member has a recessed region in which a portion of an inner surface of the stick member is recessed, the contact part is formed in at least one region of an outer surface of the stick member, and the noncontact part is formed in the recessed region.

13. The feedback device of claim 12, wherein:
the heat dissipation part includes a heat dissipation sheet disposed in the recessed region of the noncontact part and configured to dissipate the waste heat to the outside, and
at least one region of the heat dissipation sheet is connected to the heat transfer part to receive the waste heat from the heat transfer part, and the heat dissipation sheet dissipates the waste heat to the recessed region.

14. The feedback device of claim 12, wherein a charging port configured to charge driving power of the feedback device is disposed in one region of the recessed region.

15. The feedback device of claim 1, wherein the waste heat is generated when cold feedback or thermal grill feedback of the thermal feedback is output from the heat output module under control of the feedback controller, and
the heat dissipation unit dissipates the waste heat from when the cold feedback or the thermal grill feedback is output from the heat output module.

16. A feedback device providing a thermal experience according to a thermal event to a user in accordance with reproduction of game content including the thermal event, the feedback device comprising:
a casing including a stick member that is a region with which the user comes into contact in a case in which the feedback device is moved when the content is reproduced, and a half ring member that is a region with which the user does not come into contact although the feedback device is moved when the content is reproduced;
a heat output module including a first substrate and a second substrate having flexibility, a thermoelectric element disposed between the first substrate and the second substrate and configured to perform a thermoelectric operation for the thermal feedback, wherein:
the thermoelectric operation includes an exothermic operation and an endothermic operation, and a contact surface disposed on the second substrate; and
the heat output module is disposed inside or outside a curved shape of the stick member due to the flexibility of the first substrate and the second substrate and transfers heat generated by the thermoelectric operation to the user through the second substrate and the contact surface to output the thermal feedback;
a heat dissipation unit configured to dissipate waste heat from an outer surface of the half ring member when the waste heat is generated toward the first substrate as the thermoelectric element performs the endothermic operation such that temperature of at least a portion of the contact surface is less than a certain temperature, wherein:

the waste heat indicates the remaining heat, except for heat for providing the thermal feedback among the heat generated in the thermoelectric element; and the heat dissipation unit includes a heat transfer part configured to form a heat transfer path from the heat output module to the outer surface of the half ring member such that the waste heat is transferred from the heat output module to the outer surface of the half ring member; and a heat dissipation part configured to dissipate the waste heat received through the heat transfer path, wherein the waste heat is moved along the heat transfer path to the outer surface of the half ring member from the stick member in which the heat output module is disposed, and is dissipated from the outer surface of the half ring member.

17. A feedback device providing a thermal experience according to a thermal event to a user in accordance with reproduction of game content including the thermal event, the feedback device comprising:

a casing including a stick member that is a region with which the user comes into contact in a case in which the feedback device is moved when the content is reproduced, and a ring member that is a region with which the user does not come into contact although the feedback device is moved when the content is reproduced, wherein the ring member has a cavity passing through an interior of the ring member;

a heat output module including a first substrate and a second substrate having flexibility, a thermoelectric element disposed between the first substrate and the second substrate and configured to perform a thermoelectric operation for the thermal feedback, wherein:

the thermoelectric operation includes an exothermic operation and an endothermic operation, and a contact surface disposed on the second substrate; and the heat output module is disposed inside or outside a curved shape of the stick member due to the flexibility of the first substrate and the second substrate, and transfers heat generated by the thermoelectric operation to the user through the second substrate and the contact surface to output the thermal feedback;

a heat dissipation unit configured to dissipate waste heat from an outer surface of the ring member when the waste heat is generated toward the first substrate as the thermoelectric element performs the endothermic operation such that temperature of at least a portion of the contact surface is less than a certain temperature, wherein:

the waste heat indicates the remaining heat, except for heat for providing the thermal feedback among the heat generated in the thermoelectric element; and the heat dissipation unit includes a heat transfer part configured to form a heat transfer path from the heat output module to the outer surface of the ring member such that the waste heat is transferred from the heat output module to the outer surface of the ring member; and a heat dissipation part configured to dissipate the waste heat received through the heat transfer path, wherein the waste heat is moved along the heat transfer path to the outer surface of the ring member from the stick member in which the heat output module is disposed, and is dissipated from the outer surface of the ring member.

* * * * *